(12) United States Patent
Lee et al.

(10) Patent No.: US 10,861,874 B2
(45) Date of Patent: Dec. 8, 2020

(54) VERTICAL SEMICONDUCTOR DEVICES

(71) Applicant: Samsung Electronics Co., Ltd., Suwon-si (KR)

(72) Inventors: Kyung-Hwan Lee, Hwaseong-si (KR); Yong-Seok Kim, Suwon-si (KR); Jun-Hee Lim, Seoul (KR); Kohji Kanamori, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/445,433

(22) Filed: Jun. 19, 2019

(65) Prior Publication Data

US 2020/0194451 A1    Jun. 18, 2020

(30) Foreign Application Priority Data

Dec. 12, 2018  (KR) .......................... 10-2018-0159713

(51) Int. Cl.
*H01L 27/11582* (2017.01)
*H01L 27/11565* (2017.01)
*H01L 21/311* (2006.01)
*H01L 21/768* (2006.01)
*H01L 21/762* (2006.01)

(52) U.S. Cl.
CPC .. *H01L 27/11582* (2013.01); *H01L 21/31116* (2013.01); *H01L 21/76224* (2013.01); *H01L 21/76831* (2013.01); *H01L 21/76832* (2013.01); *H01L 27/11565* (2013.01)

(58) Field of Classification Search
CPC ........... H01L 27/11582; H01L 27/1158; H01L 27/11565; H01L 27/11563
See application file for complete search history.

(56) References Cited

U.S. PATENT DOCUMENTS

| | | |
|---|---|---|
| 8,072,025 B2 | 12/2011 | Nishihara et al. |
| 8,933,505 B2 | 1/2015 | Jang et al. |
| 9,576,976 B1 | 2/2017 | Hu et al. |
| 9,911,790 B1 | 3/2018 | Shimabukuro et al. |

(Continued)

OTHER PUBLICATIONS

Wu et al. "Device Characteristics of Single-Gate Vertical Channel (SGVC) 3D NAND Flash Architecture." 978-1-4673-8833-7/16 © 2016 IEEE.

*Primary Examiner* — Marc Anthony Armand
(74) *Attorney, Agent, or Firm* — Muir Patent Law, PLLC

(57) ABSTRACT

A vertical semiconductor device includes conductive pattern structures extending in a first direction, a trench between two adjacent conductive pattern structures in a second direction crossing the first direction, a memory layer disposed on sidewalls of the trench, first insulation layers disposed in the trench and spaced apart from each other in the first direction, channel patterns disposed on the memory layer and in the trench and spaced apart from each other in the first direction, and etch stop layer patterns disposed in the trench. Each conductive pattern structure includes conductive patterns and insulation layers alternately stacked on an upper surface of the substrate. Each etch stop layer pattern is disposed between a corresponding first insulation layer and the blocking dielectric layer. Etch stop layer patterns are spaced apart from each other in the first direction.

20 Claims, 32 Drawing Sheets

(56) References Cited

U.S. PATENT DOCUMENTS

| | | |
|---|---|---|
| 9,960,182 B2 | 5/2018 | Choi et al. |
| 2015/0200203 A1* | 7/2015 | Jang ................. H01L 27/11582 |
| | | 257/324 |
| 2017/0243651 A1* | 8/2017 | Choi ................... H01L 27/1157 |
| 2017/0243945 A1 | 8/2017 | Sekine et al. |
| 2018/0083028 A1 | 3/2018 | Fukumoto et al. |

* cited by examiner

VERTICAL SEMICONDUCTOR DEVICES

CROSS-REFERENCE TO RELATED APPLICATION

This application claims priority under 35 USC § 119 to Korean Patent Application No. 10-2018-0159713, filed on Dec. 12, 2018 in the Korean Intellectual Property Office (KIPO), the contents of which are incorporated by reference herein in their entirety.

BACKGROUND

1. Field

Example embodiments relate to vertical semiconductor devices. More particularly, example embodiments relate to vertical semiconductor devices having a stable structure.

2. Description of the Related Art

Vertical semiconductor devices including a plurality of memory cells vertically stacked at a plurality of levels, respectively, on a substrate have been developed. A dry etching process may be performed to form memory cells stacked in the vertical direction, and thus, etching damages may occur at layer patterns included in the memory cells.

SUMMARY

Example embodiments provide a vertical semiconductor device vertical semiconductor device having improved electrical characteristics and reduced etching damage.

Example embodiments provide method of manufacturing the vertical semiconductor device.

According to an exemplary embodiment, a vertical semiconductor device includes conductive pattern structures extending in a first direction, a trench between two adjacent conductive pattern structures spaced apart from each other in a second direction crossing the first direction, a memory layer disposed on sidewalls of the trench, first insulation layers disposed in the trench and spaced apart from each other in the first direction, channel patterns disposed on the memory layer and in the trench and spaced apart from each other in the first direction, and etch stop layer patterns disposed in the trench. Each conductive pattern structure includes conductive patterns and insulation layers alternately and repeatedly stacked on a substrate in a third direction perpendicular to an upper surface of the substrate. The memory layer includes a blocking dielectric layer, a charge storage layer and a tunnel insulation layer stacked on each other on the sidewalls of the trench. Each etch stop layer pattern is disposed between a corresponding first insulation layer and the blocking dielectric layer. Etch stop layer patterns are spaced apart from each other in the first direction.

According to an exemplary embodiment of the present inventive concept, a vertical semiconductor device includes conductive pattern structures, each of the plurality of conductive pattern structures extending in a first direction, a trench between two adjacent conductive pattern structures that are spaced apart from each other in a second direction crossing the first direction, a memory layer disposed on sidewalls of the trench, channel patterns disposed on the memory layer and in the trench, and spaced apart from each other in the first direction, and etch stop layer patterns disposed in the trench and spaced apart from each other in the first direction. The memory layer includes a blocking dielectric layer, a charge storage layer and a tunnel insulation layer stacked on each other on the sidewalls of the trench. Each conductive pattern structure includes conductive patterns and insulation layers alternately and repeatedly stacked on a substrate in a third direction perpendicular to an upper surface of the substrate. Each etch stop layer pattern and a corresponding channel pattern are layered in the second direction and in the trench.

According to an exemplary embodiment of the present inventive concept, a vertical semiconductor device includes conductive pattern structures, each conductive pattern structure extending in a first direction, a trench between two adjacent conductive pattern structures that are spaced apart from each other in a second direction crossing the first direction, a memory layer disposed on sidewalls of the trench, channel patterns disposed on the memory layer and in the trench, and spaced apart from each other in the first direction, first insulation layers disposed on the channel patterns in the trench and spaced apart from each other in the first direction, and etch stop layer patterns spaced apart from each other in the first direction. The memory layer includes a blocking dielectric layer, a charge storage layer and a tunnel insulation layer stacked on each other on the sidewalls of the trench. Each conductive pattern structure includes conductive patterns and insulation layers alternately and repeatedly stacked on a substrate in a third direction perpendicular to an upper surface of the substrate. Each etch stop layer pattern is disposed between a corresponding first insulation layer and the blocking dielectric layer.

According to an exemplary embodiment of the present inventive concept, a method of manufacturing a vertical semiconductor device is provided as follows. Conductive pattern structures are formed. Each conductive pattern structure extends in a first direction. A trench is formed between two adjacent conductive pattern structures that are spaced apart from each other in a second direction crossing the first direction. A memory layer is formed on sidewalls of the trench. The memory layer includes a blocking dielectric layer, a charge storage layer and a tunnel insulation layer that are stacked in the second direction on each other on the sidewalls of the trench. A channel layer and an etch stop layer are formed on the memory layer. A preliminary first insulation layer is formed on the etch stop layer to fill the trench. First holes are formed in the preliminary first insulation layer using a dry etching process, thereby exposing the etch stop layer and forming first insulation layers disposed in the trench and spaced apart each other in the first direction. The etch stop layer and the channel layer are etched through the first holes using a wet etching process to form etch stop layer patterns and channel patterns arranged in the first direction.

According to an exemplary embodiment of the present inventive concept, a vertical semiconductor device includes an etch stop layer pattern. A dry etching process is performed to expose the etch stop layer pattern, and then a wet etching process is performed. Accordingly, damages due to the dry etching process performed on a memory cell are reduced, and thus the vertical semiconductor device may have excellent electrical characteristics.

BRIEF DESCRIPTION OF THE DRAWINGS

Example embodiments will be more clearly understood from the following detailed description taken in conjunction with the accompanying drawings.

FIG. 1 is a perspective view illustrating a vertical semiconductor device in accordance with example embodiments;

FIGS. 2 and 3 are a plan view and a cross-sectional view illustrating portions of vertical semiconductor devices in accordance with example embodiments, respectively;

FIGS. 4 and 5 are a plan view and a cross-sectional view illustrating portions of a vertical semiconductor device in accordance with example embodiments;

FIGS. 6 to 18 are perspective views and plan views illustrating stages of a method of manufacturing a vertical semiconductor device in accordance with example embodiments;

FIG. 19 is a perspective view illustrating a vertical semiconductor device in accordance with example embodiments;

FIG. 20 is a perspective view illustrating stages of a method of manufacturing a vertical semiconductor device in accordance with example embodiments;

FIGS. 21 and 22 are a plan view and a cross-sectional view illustrating a vertical semiconductor device in accordance with example embodiments, respectively;

FIGS. 23 to 26 are plan views illustrating stages of a method of manufacturing a vertical semiconductor device in accordance with example embodiments;

FIGS. 27 and 28 are a plan view and a cross-sectional view illustrating a vertical semiconductor device in accordance with example embodiments;

FIGS. 29 to 32 are plan views illustrating stages of a method of manufacturing a vertical semiconductor device in accordance with example embodiments;

FIGS. 33 and 34 are a plan view and a cross-sectional view illustrating a vertical semiconductor device according to exemplary embodiments; and FIGS. 35 to 37 are plan views illustrating stages of a method of manufacturing a vertical semiconductor device in accordance with example embodiments.

DESCRIPTION OF EMBODIMENTS

Example embodiments will be more clearly understood from the following detailed description taken in conjunction with the accompanying drawings.

In the specification, a direction substantially parallel to an upper surface of a substrate is defined as a first direction. A direction substantially parallel to the upper surface of the substrate and perpendicular to the first direction is defined as a second direction. A direction substantially perpendicular to the upper surface of the substrate is defined as a vertical direction.

Figure 1:
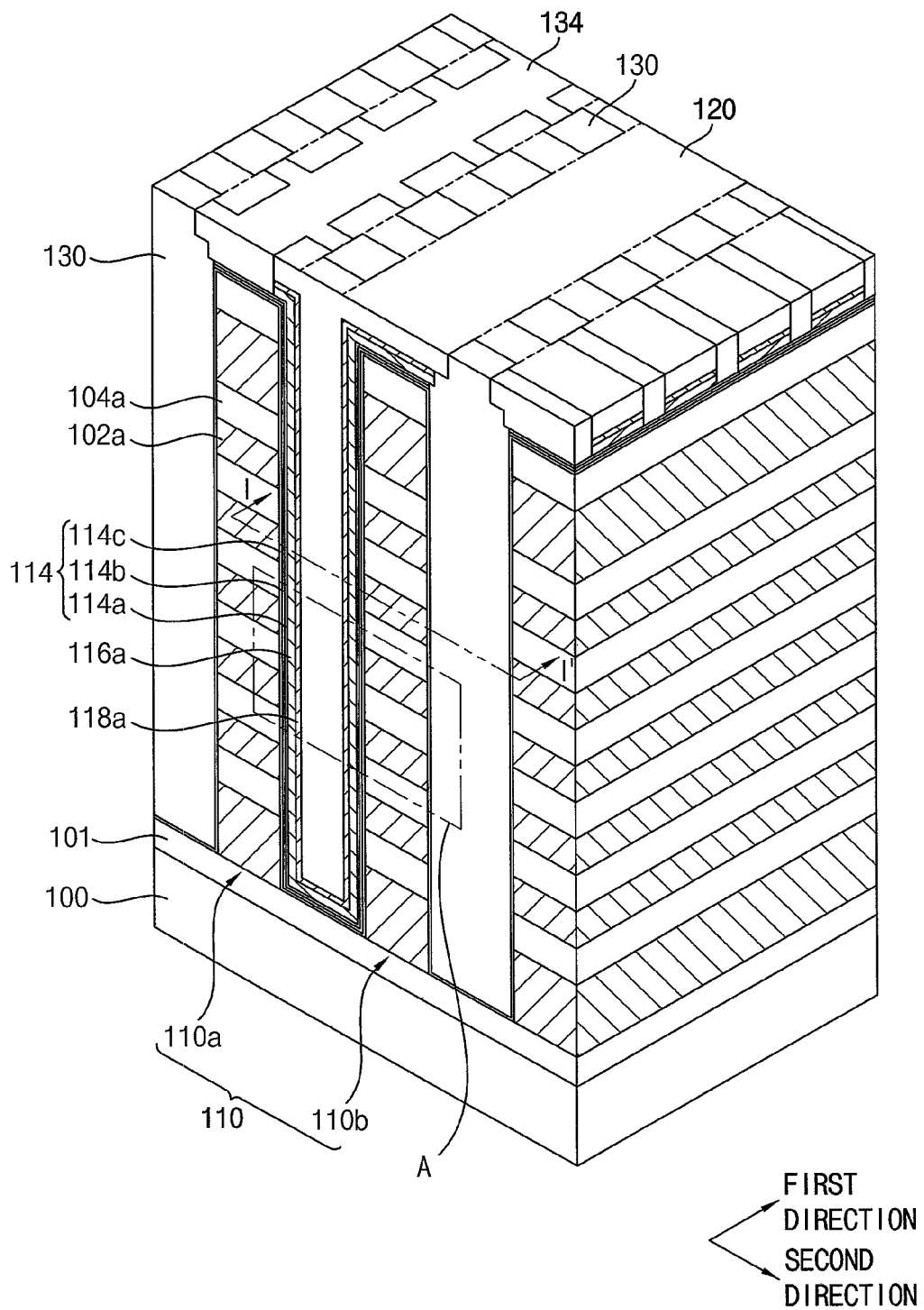
FIGS. 1 to 37 represent non-limiting, example embodiments as described herein.
Figure 2:
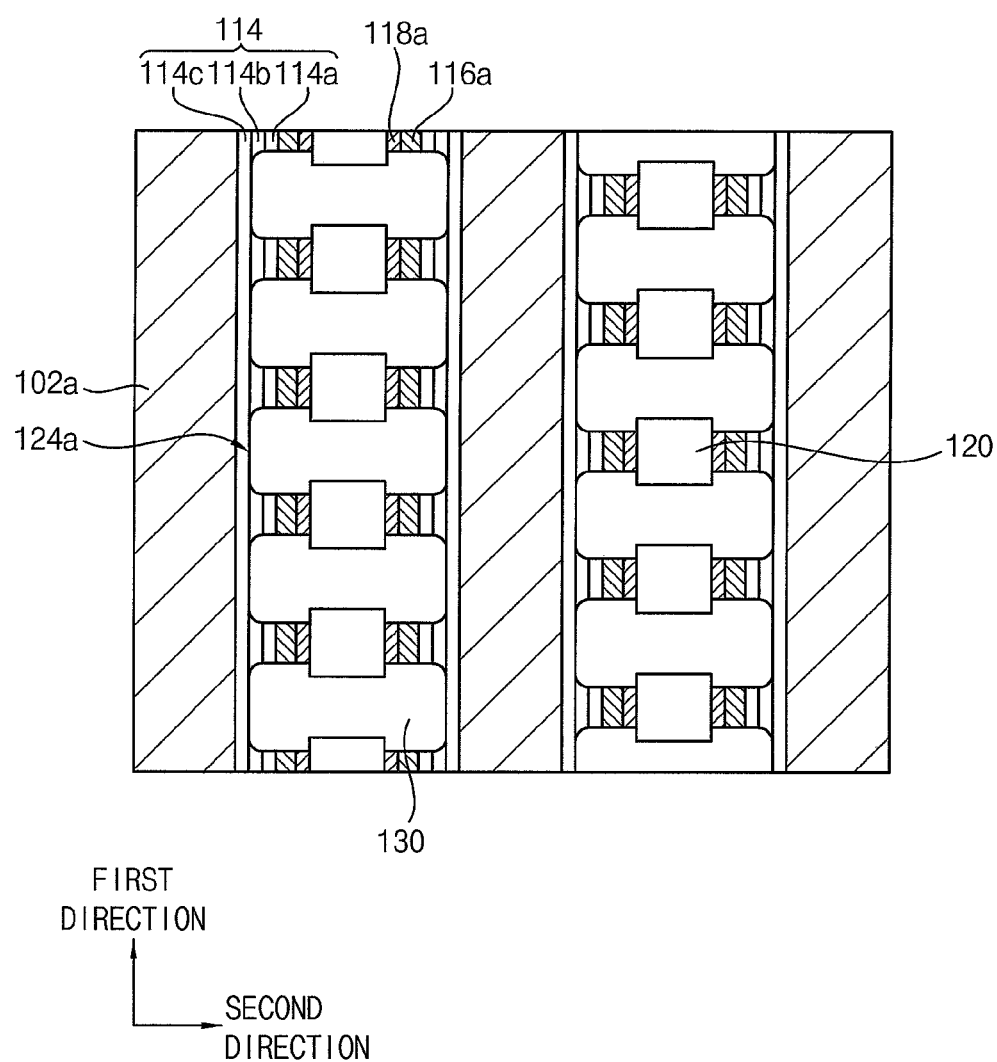
Figure 3:
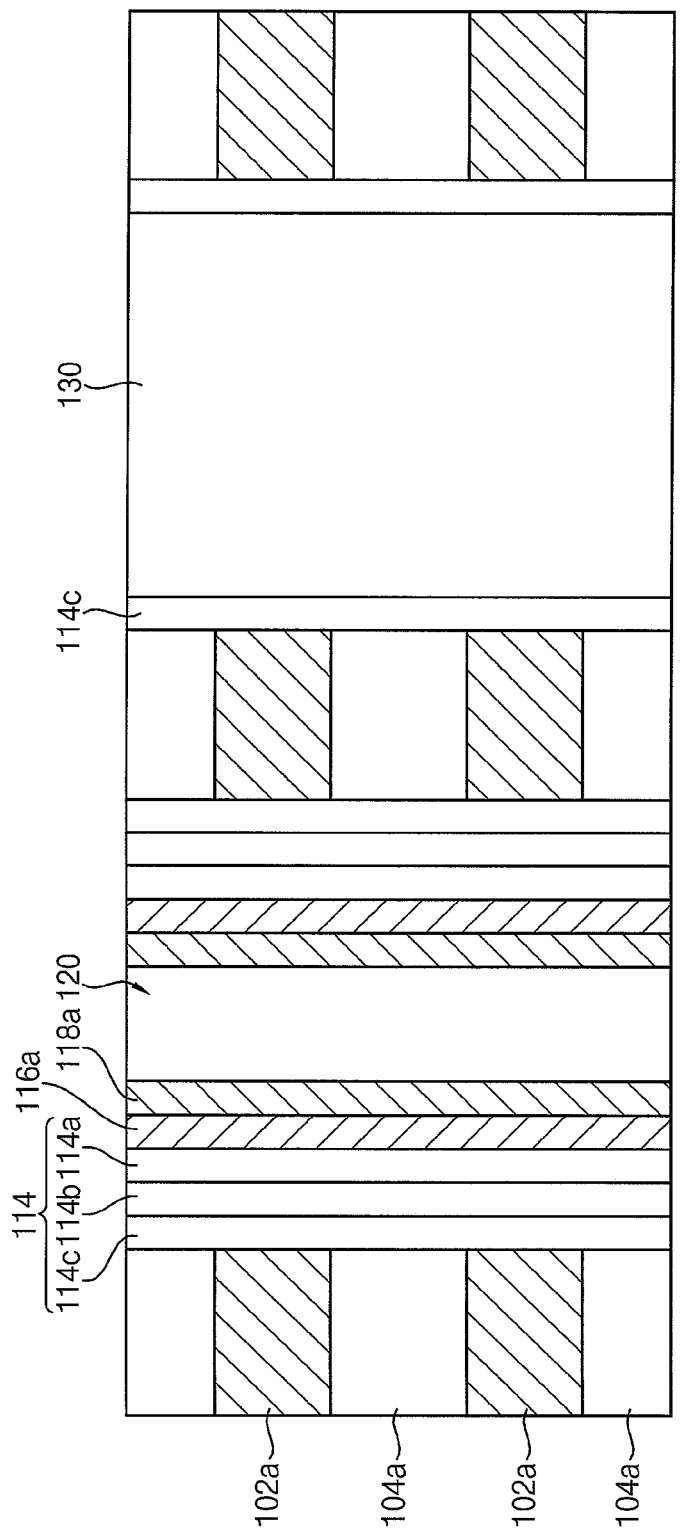
Figure 4:
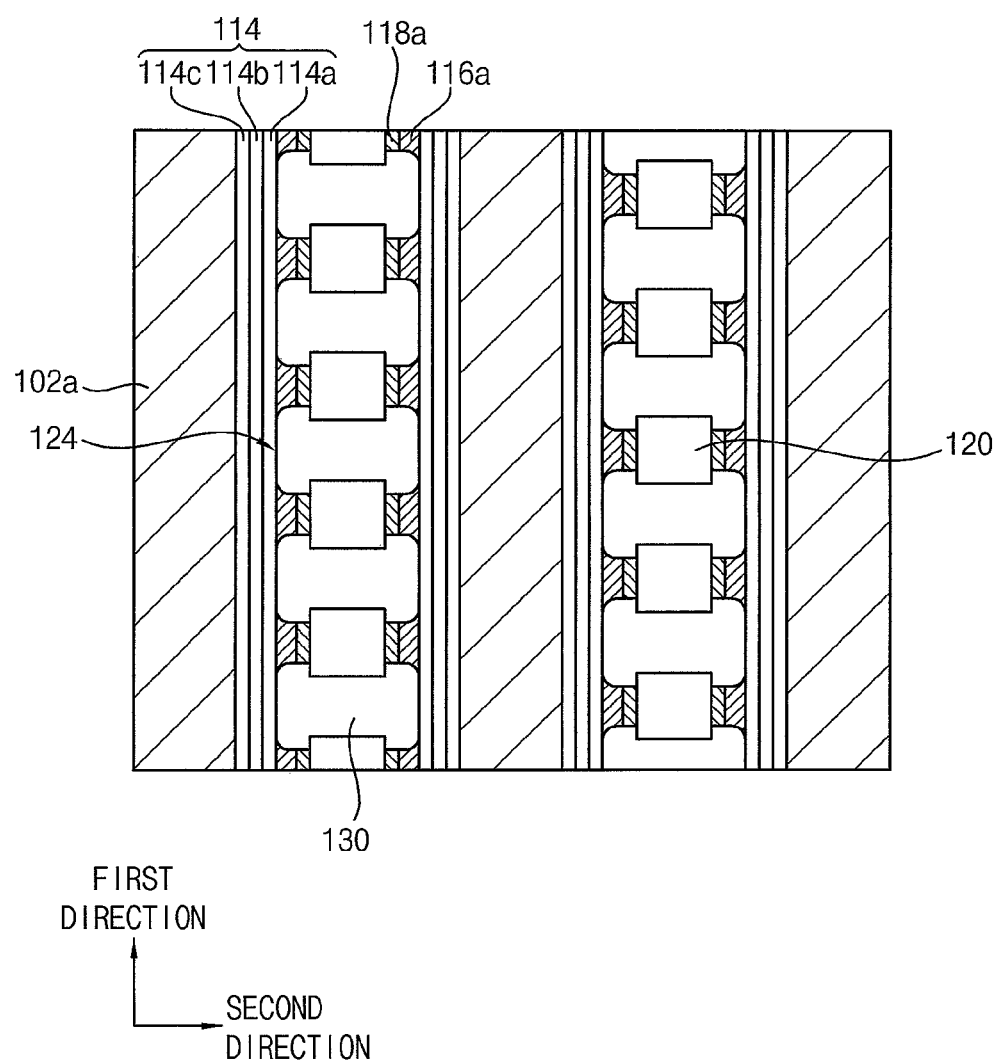
Figure 5:
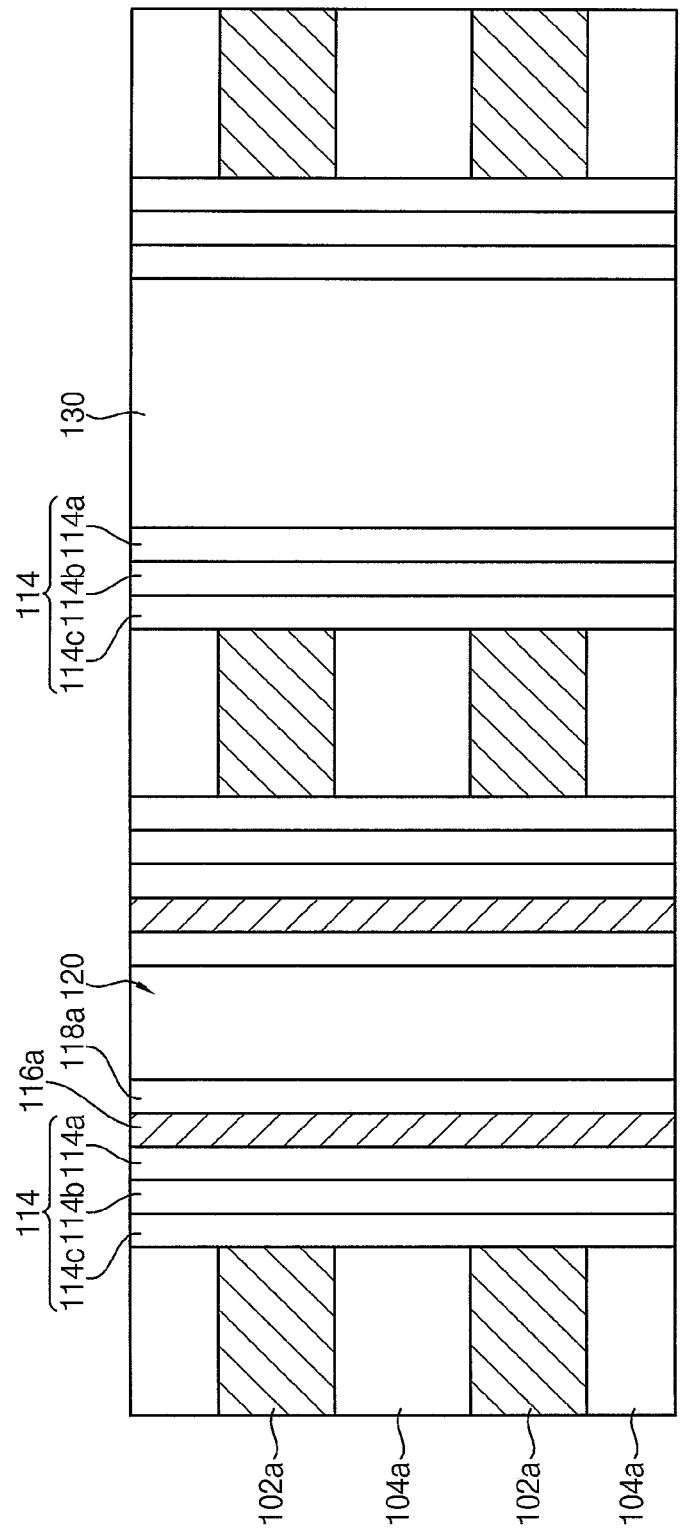

FIG. 1 is a perspective view illustrating a vertical semiconductor device in accordance with example embodiments. FIGS. 2 and 3 are a plan view and a cross-sectional view illustrating portions of vertical semiconductor devices in accordance with example embodiments, respectively. FIGS. 4 and 5 are a plan view and a cross-sectional view illustrating portions of a vertical semiconductor device in accordance with example embodiments.

Each of FIGS. 2 and 4 is a plan view taken along line I-I' of FIG. 1. Each of FIGS. 3 and 5 is a cross-sectional view of an "A" portion of FIG. 1.

Referring to FIGS. 1 to 3, a lower insulation layer 101 may be formed on a substrate 100. A plurality of the conductive pattern structures 110 may be arranged spaced apart from each other in the second direction. Each of the conductive pattern structures 110 may extend in the first direction. Each of the conductive pattern structures 110 having conductive patterns 102a and insulation patterns 104a repeatedly and alternately stacked on each other may be formed on the lower insulation layer 101.

The substrate 100 may include a semiconductor material. The substrate 100 may include, e.g., a silicon substrate, a germanium substrate or a silicon-germanium substrate.

A plurality of the conductive pattern structures 110 may be arranged in the second direction. Each of the conductive pattern structures 110 may extend in the first direction. A trench 112 (refer to FIG. 7) may be formed between two adjacent conductive pattern structures of the conductive pattern structures 110. For the clarity of drawings, the trench 112 may be omitted on some drawings (e.g., FIG. 1). In FIG. 1, dash lines indicate an extending direction of the trench. In this case, the trench 112 may be identified with reference to FIG. 7, and the trench 112 may extend in the first direction. The conductive patterns 102a may serve as gate electrodes of transistors, respectively.

In example embodiments, the conductive patterns 102a may include polysilicon.

In some example embodiments, the conductive patterns 102a may include metal that may be easily removed by a dry etching process. The conductive patterns 102a may include, e.g., titanium, titanium nitride, tantalum, tantalum nitride, etc.

In example embodiments, the insulation patterns 104a may include an oxide-based material, e.g., silicon oxide, silicon carbonate, silicon oxyfluoride, etc.

Hereinafter, a pair of neighboring conductive pattern structures of the conductive pattern structures 110 may be described as first and second conductive pattern structures 110a and 110b, respectively.

In example embodiments, the conductive pattern 102a (i.e., a first uppermost conductive pattern) disposed at a top portion of the first conductive pattern structure 110a may serve as a gate electrode of a string selection transistor SST. The conductive pattern 102a (i.e., a second uppermost conductive pattern) disposed at a top portion of the second conductive pattern structure 110b may serve as a gate electrode of a ground selection transistor (GST).

In addition, the conductive patterns 102a disposed under the top portions of the first and second conductive pattern structures 110a and 110b may serve as gate electrodes of the cell transistors. That is, the gate electrodes of the cell transistors may serve as word lines, respectively. In some example embodiments, the conductive patterns 102a (i.e. lowermost conductive patterns) disposed at lowermost portions of the first and second conductive pattern structures 110a and 110b may serve as gate electrodes of assist transistors.

A memory layer 114 may be conformally formed on surfaces of the conductive pattern structures 110. The memory layer 114 may also be conformally formed on the lower insulation layer 101 between two adjacent conductive pattern structures of the conductive pattern structures 110. A channel pattern 116a and an etch stop layer pattern 118a may be formed on the memory layer 114. That is, the etch stop layer pattern 118a may not directly contact the memory layer 114.

The memory layer 114 may include a blocking dielectric layer 114c, a charge storage layer 114b, and a tunnel insulation layer 114a stacked. For example, the blocking dielectric layer 114c may include silicon oxide, the charge storage layer 114b may include silicon nitride, and the tunnel insulation layer 114a may include silicon oxide.

The channel pattern 116a may be formed on sidewalls of the first and second conductive pattern structures 110a and 110b and the lower insulation layer 101 between the first and second conductive pattern structures 110a and 110b. The channel pattern 116a may be formed on a portion of an upper surface of the conductive pattern structure 110. The channel pattern 116a may include, e.g., polysilicon.

In the cross-sectional view, the channel pattern 116a formed in the trench 112 may have a U-shape. In an example embodiment, the channel pattern 116a in plural (i.e., a plurality of channel patterns 116a) formed in the trench 112 may be spaced apart from each other in the first direction.

The etch stop layer pattern 118a may be formed on each of the channel patterns 116a in the trench 112. In an example embodiment, the etch stop layer pattern 118a in plural (i.e., a plurality of etch stop layer patterns 118a) may be disposed in the trench 112 to be spaced apart from each other in the first direction.

The etch stop layer pattern 118a may include a material having a high etching selectivity with respect to a material of a first insulation layer subsequently described, in a dry etching process. For example, the etch stop layer pattern 118a may include a material having a high etching selectivity with respect to silicon oxide, in a dry etch process. That is, when the silicon oxide is dry-etched, the etch stop layer pattern 118a may be hardly etched.

Also, the etch stop layer pattern 118a may include a material that may be easily removed through a wet etching process.

In example embodiments, the etch stop layer pattern 118a may include, e.g., aluminum oxide, aluminum nitride, silicon nitride, doped silicon, germanium, etc.

A first insulation layer 120 may be formed on the etch stop layer pattern 118a to fill at least a portion of the trench 112. The first insulation layer 120 may include silicon oxide. In an example embodiment, the first insulation layer 120 in plural (i.e., a plurality of first insulation layers 120) may be formed in the trench 112 to be spaced apart from each other in the first direction.

Thus, the channel pattern 116a, the etch stop layer pattern 118a, and the first insulation layer 120 formed in the trench 112 may serve as a pillar structure having a pillar shape. The pillar structure in plural may be formed in the trench 112 and may be arranged spaced apart from each other in the first direction. In an example embodiment, the etch stop layer pattern 118a, the channel pattern 116a, the tunnel insulation layer 114a, the charge storage layer 114b may be stacked on each other or layered in the second direction between the first insulation layer 120 and the blocking dielectric layer 114c.

A filling insulation pattern 130 may fill a portion between the pillar structures in the trench 112. Thus, the channel patterns 116a disposed in the trench 112 may be spaced apart from each other in the first direction by the filling insulation pattern 130. That is, the filling insulation pattern 130 may be located in a region between the memory cells in the trench 112. The channel pattern 116a, the memory layer 114, and one of the conductive patterns 102a that are positioned at the same level from the substrate 100 may serve as one memory cell.

For example, the filling insulation pattern 130 may include silicon oxide. In this case, the filling insulation pattern 130 and the first insulation layer 120 may include substantially the same material, and thus the filling insulation pattern 130 and the first insulation layer 120 may be merged into one insulation structure. In some example embodiments, the filling insulation pattern 130 may include a low-k dielectric material having a dielectric constant lower than that of the silicon oxide. In this case, the filling insulation pattern 130 has a material different from that of the first insulation layer 120.

In example embodiments, both sides in the second direction of the filling insulation pattern 130 may contact one layer included in the memory layer 114. At least one layer included in the memory layer 114 disposed in the trench 112 may be separated into a plurality of islands that are spaced apart from each other in the first direction.

In example embodiments, as shown in FIGS. 2 and 3, the both sides in the second direction of the filling insulation pattern 130 may contact the blocking dielectric layer 114c. In this case, the blocking dielectric layer 114c may be continuously formed on the sidewall of the conductive pattern structure 110, and stacked structures including the tunnel insulation layer 114a and the charge storage layer 114b may be formed on the sidewall of the conductive pattern structure 110 to be spaced apart from each other in the first direction. Thus, the blocking dielectric layer 114c and the filling insulation pattern 130 may be formed in the trench 112 between the memory cells.

Also, the blocking dielectric layer 114c, the charge storage layer 114b, the tunnel insulation layer 114a, the channel pattern 116a, the etch stop layer pattern 118a, and the first insulation layer 120 may be sequentially stacked on the sidewalls of the trench 112 for forming the memory cell. As the charge storage layers 114b in the neighboring memory cells may be spaced from each other, a disturbance or interference between data stored in the neighboring memory cells may decrease.

In example embodiments, as shown in FIGS. 4 and 5, the both sides in the second direction of the filling insulation pattern 130 may contact the tunnel insulation layer 114a. In this case, the tunnel insulation layer 114a, the charge storage layer 114b, and the blocking dielectric layer 114c may be continuously formed on the sidewalls of the conductive pattern structure 110. Thus, the blocking dielectric layer 114c, the charge storage layer 114b, the tunnel insulation layer 114a, and the filling insulation pattern 130 may be formed in the trench 112 between the memory cells.

The present invention is not limited thereto. In an example embodiment, which is not shown, the both sides of the filling insulation pattern 130 in the second direction may contact the charge storage layer 114b. In this case, the blocking dielectric layer 114c and the charge storage layer 114b may be formed continuously on the sidewalls of the conductive pattern structure 110. Thus, the blocking dielectric layer 114c, the charge storage layer 114b, and the filling insulation pattern 130 may be formed in the trench 112 between the memory cells.

A width in the first direction of an edge portion in the second direction in the filling insulation pattern 130 may be greater than a width in the first direction of a central portion in the second direction. The edge portion may contact the tunnel insulation layer 114a. The central portion may be disposed between two first insulation layers of the first insulation layers 120 that are arranged in the first direction. In an example embodiment, a width in the first direction of the channel pattern 116a may be less than a width in the first direction of the first insulation layer 120.

In addition, the filling insulation pattern 130 may have a rounded shape of both ends in the first direction of an edge portion in the second direction. For example, the filling insulation pattern 130 may have rounded corners.

In example embodiments, the channel patterns 116a formed on upper surfaces of neighboring first and second conductive pattern structures 110a and 110b may have different arrangements to each other. For example, the channel patterns 116a formed on the upper surface of the first conductive pattern structure 110a may have positions in the trench 112 that are shifted in the first direction from the positions of the channel patterns 116a formed on the upper surface of the second conductive pattern structure 110b.

For example, the channel patterns 116a on the upper surface of the first conductive pattern structure 110a may be spaced apart from each other in the first direction. However, the channel patterns 116a on the upper surface of the second conductive pattern structure 110b may be connected to each other in the first direction. In this case, the channel patterns 116a formed on the upper surface of the first conductive pattern structure 110a may be connected to the string selection transistor, and the channel patterns 116a formed on the upper surface of the second conductive pattern structure 110b may be connected to the ground selection transistor.

The channel pattern 116a, the memory layer 114, and one of the conductive patterns 102a may serve as one memory cell. In a cross-sectional view, the channel pattern 116a formed in the trench 112 may have a U-shape. Thus, the memory cells formed on the channel pattern 116a may be arranged to have a U-shape so that one cell string may have a U-shape.

An upper insulation layer 134 may be formed on a portion of the upper surface of the conductive pattern structure 110.

The channel pattern 116a formed on the upper surface of the first conductive pattern structure 110a may be electrically connected to a bit line contact (not shown) and a bit line (not shown). The bit line may extend in the second direction.

The channel pattern 116a formed on the upper surface of the second conductive pattern structure 110b may be connected to a ground contact (not shown) and a ground line (not shown).

As the etch stop layer pattern 118a is formed, surface damages of layers due to plasma may be decreased in process of forming the channel pattern and/or the memory layer. Thus, the vertical semiconductor device may have excellent electrical characteristics.

FIGS. 6 to 18 are perspective views and plan views illustrating stages of a method of manufacturing a vertical semiconductor device in accordance with example embodiments.

Particularly, FIGS. 6, 7, 9, 11, 12, 14, 17 and 18 are perspective views, and FIGS. 8, 10, 13, 15 and 16 are plan views. Each of a plan views is taken along line I-I' of FIG. 1. In FIGS. 12, 14, 17 and 18, dash lines indicate an extending direction of the trench.

Figure 6:
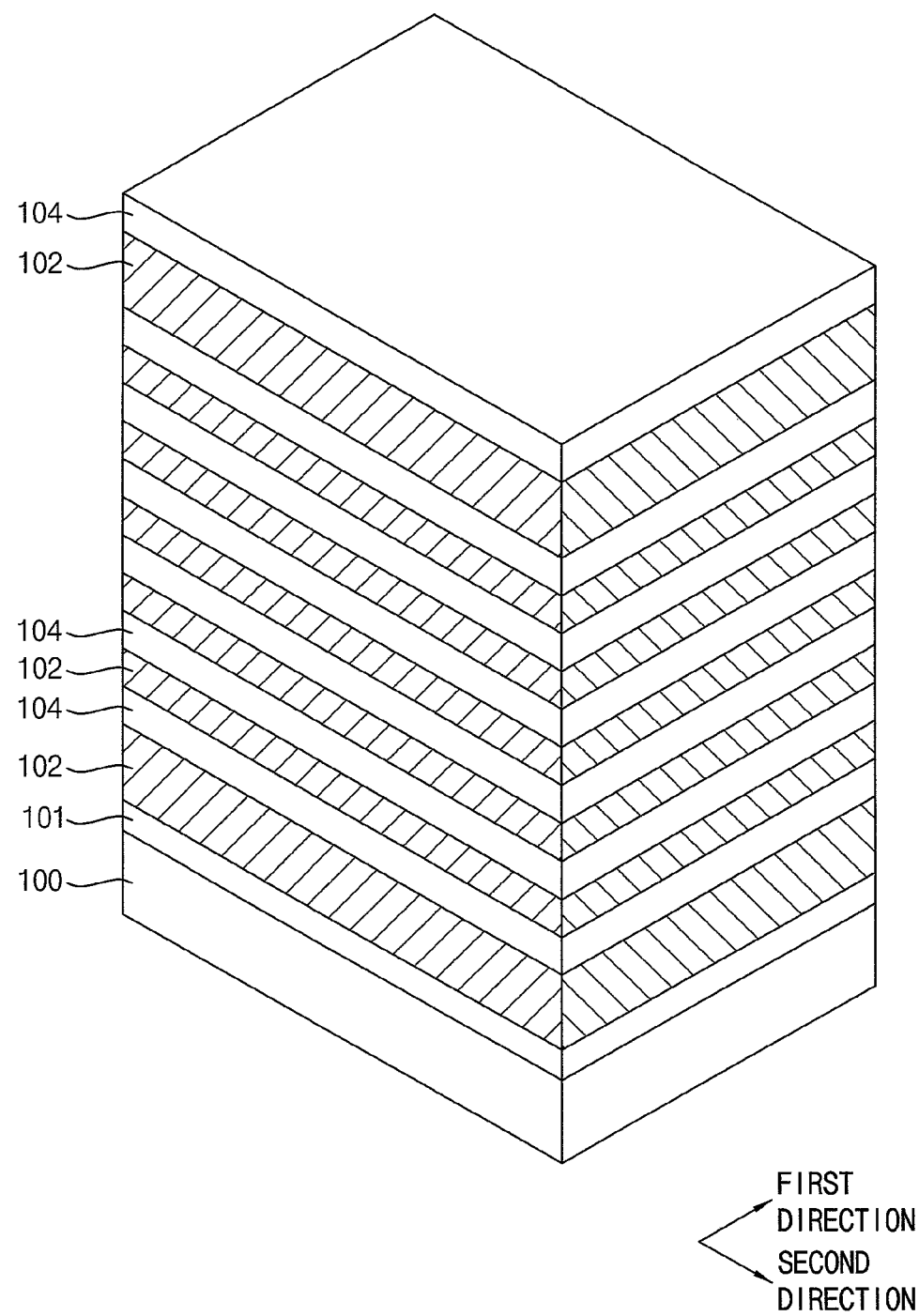

Referring to FIG. 6, a lower insulation layer 101 may be formed on a substrate 100. Conductive layers 102 and insulation layers 104 may be alternately and repeatedly formed on the lower insulation layer 101.

In example embodiments, the conductive layers 102 may include polysilicon. In some example embodiments, the conductive layers 102 may be formed of a metal that may be easily removed by a dry etching. For example, the conductive layers 102 may include, e.g., titanium, titanium nitride, tantalum, tantalum nitride, etc.

In example embodiments, the insulation layers 104 may be formed of an oxide-based material, e.g., silicon oxide, silicon carbonate, silicon oxyfluoride, etc.

Figure 7:
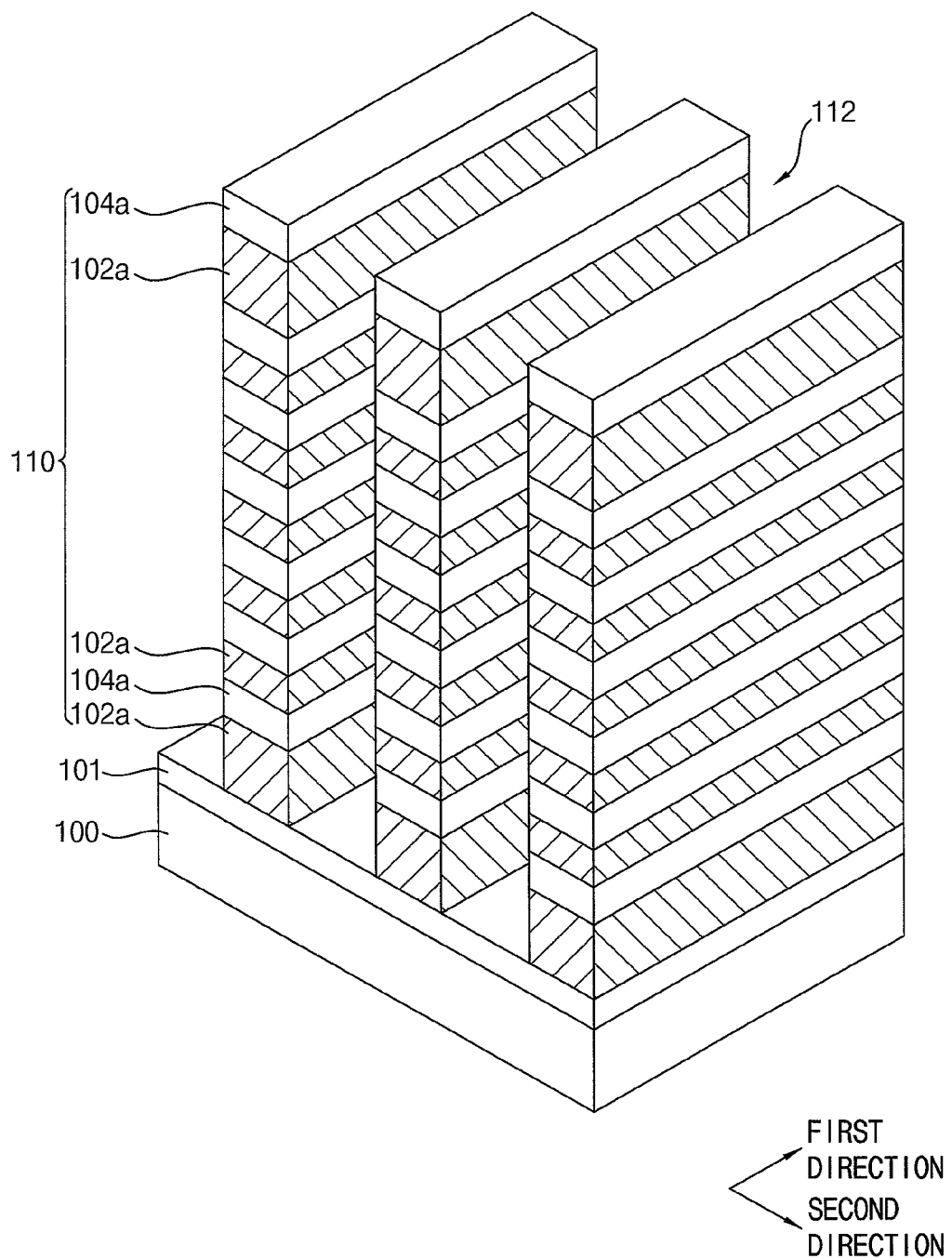
Figure 8:
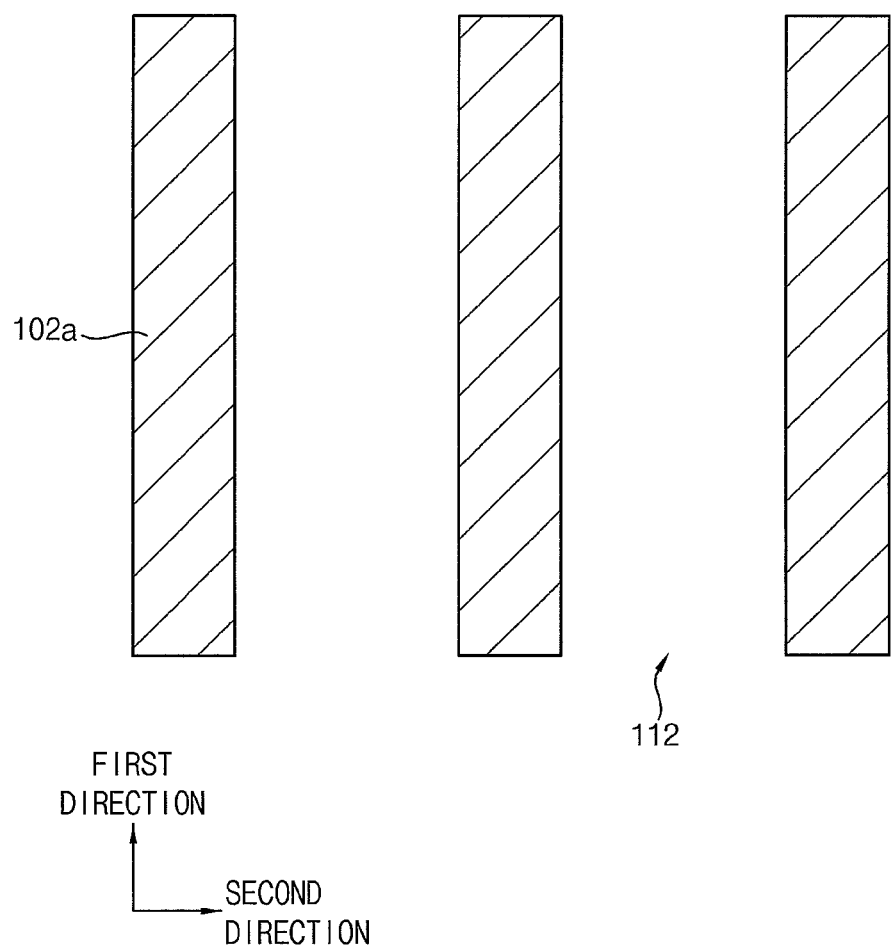

Referring to FIGS. 7 and 8, portions of the conductive layers 102 and the insulation layers 104 may be etched to form a conductive pattern structure 110 on the lower insulation layer 101. The conductive pattern structure 110 may include the conductive patterns 102a and the insulation patterns 104a alternately and repeatedly stacked.

The conductive pattern structure 110 may extend in the first direction to have a line shape. The plurality of conductive pattern structures 110 may be spaced apart from each other in the second direction. Thus, a trench 112 extending in the first direction may be formed between two adjacent conductive pattern structures of the conductive pattern structures 110.

The conductive patterns 102a may serve as gate electrodes of transistors included in cell strings through subsequent processes.

Figure 9:
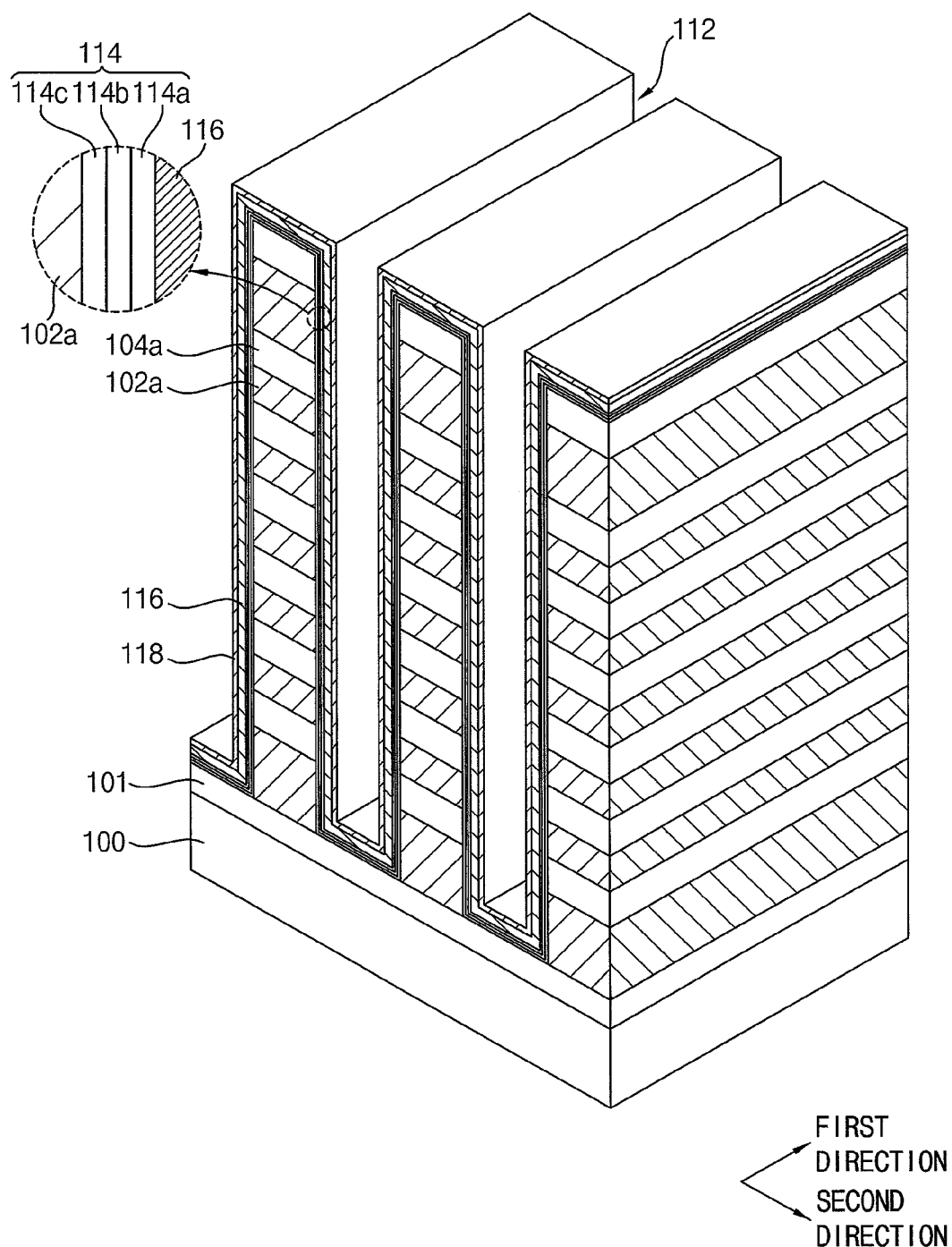
Figure 10:
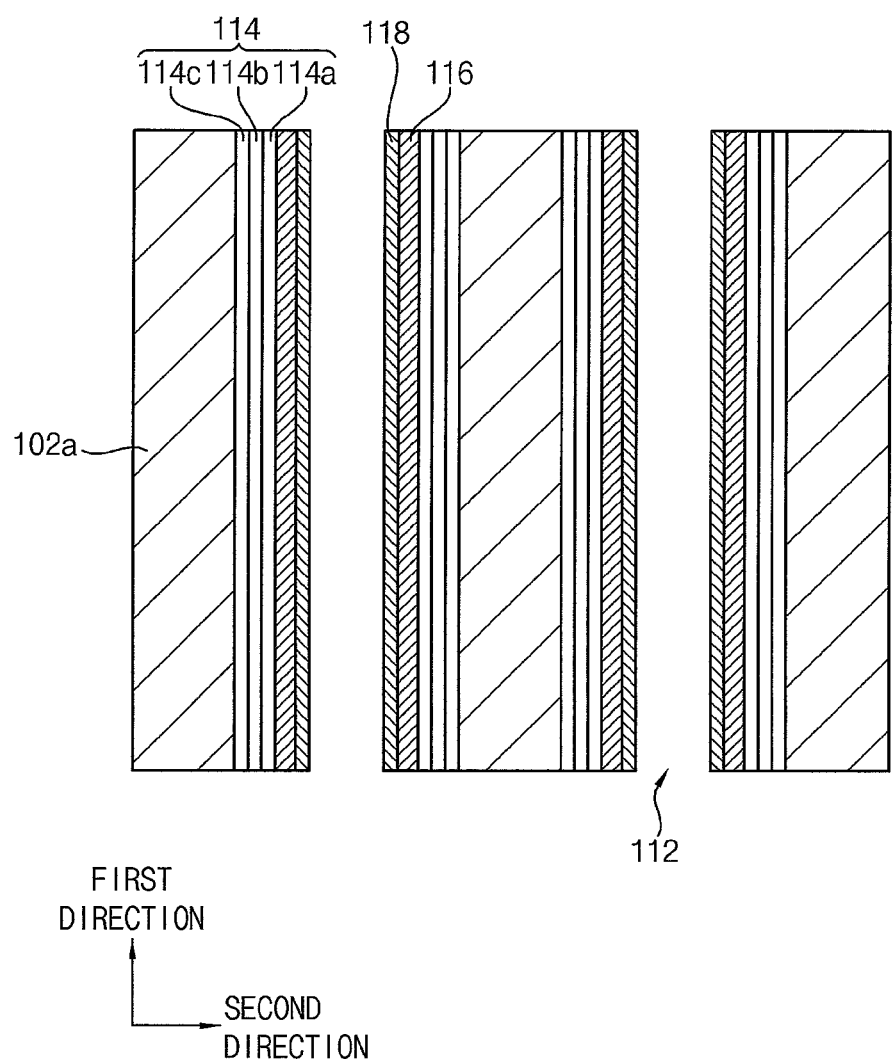

Referring to FIGS. 9 and 10, a memory layer 114 may be formed on surfaces of the conductive pattern structure 110 and the lower insulation layer 101. A channel layer 116 and an etch stop layer 118 may be formed on the memory layer 114.

The memory layer 114, the channel layer 116 and the etch stop layer 118 may be conformally formed on a sidewall and an upper surface of the conductive pattern structure 110 and the lower insulation layer 101 exposed by a bottom of the trench 112. After the etch stop layer 118 is formed, an inner space of the trench 112 may remain. In an example embodiment, the etch stop layer 118 may partially fill the trench 112.

The memory layer 114 may include a blocking dielectric layer 114c, a charge storage layer 114b, and a tunnel insulation layer 114a sequentially stacked from the sidewall of the conductive pattern structure 110. For example, the blocking dielectric layer 114c may include silicon oxide, the charge storage layer 114b may include silicon nitride, and the tunnel insulation layer 114a may include silicon oxide.

The channel layer 116 may include, e.g., polysilicon.

The etch stop layer 118 may include a material having a high etching selectivity with respect to a material of a first insulation layer subsequently formed, in a dry etching process. For example, the etch stop layer 118 may include a material having a high etching selectivity with respect to silicon oxide, in the dry etching process. That is, when the silicon oxide is dry-etched, the etch stop layer 118 may be hardly etched.

In addition, the etch stop layer 118 may include a material that may be removed by a wet etching process.

In example embodiments, the etch stop layer 118 may include, e.g., aluminum oxide, aluminum nitride, silicon nitride, doped silicon, germanium, etc.

Figure 11:
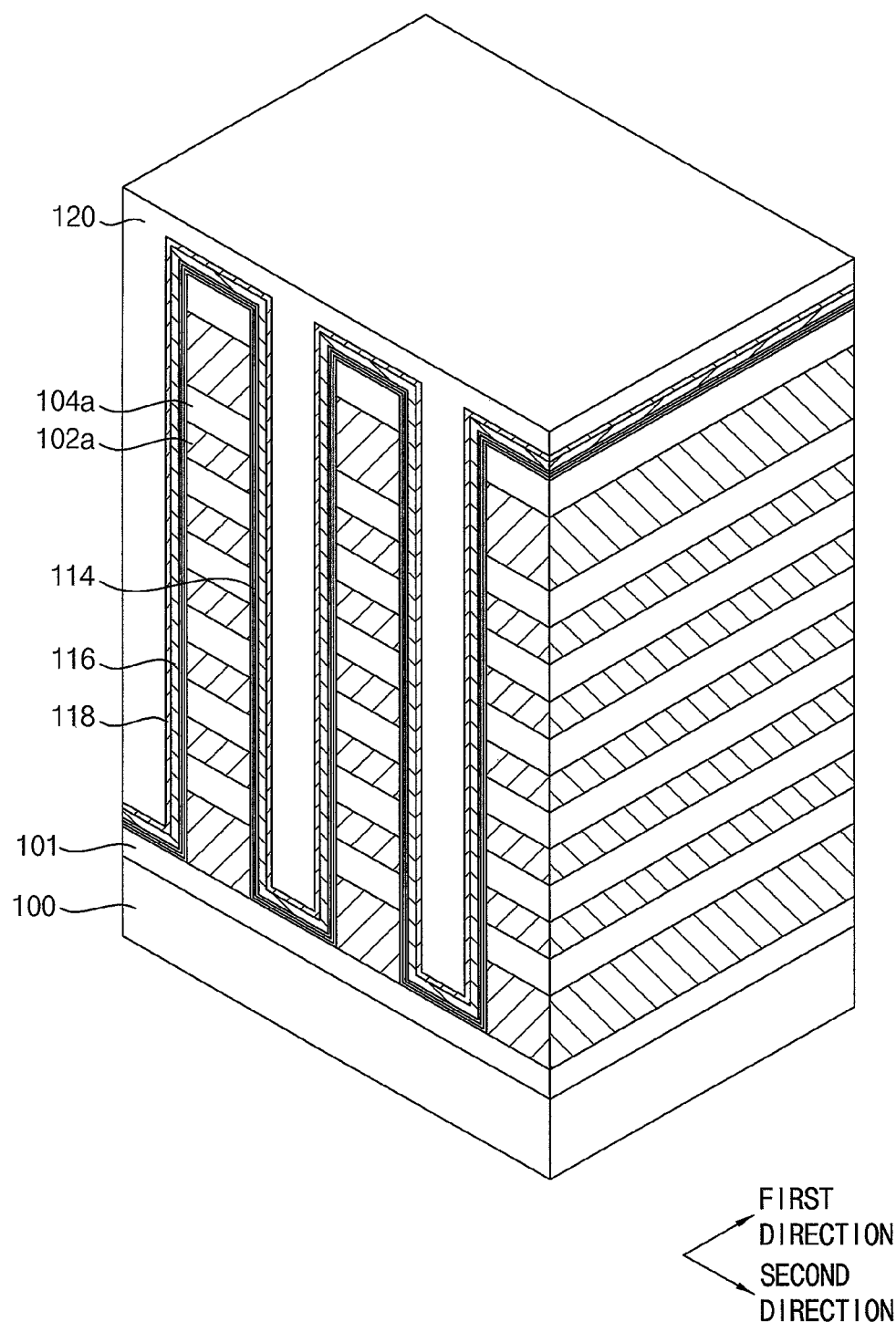

Referring to FIG. 11, the first insulation layer 120 may be formed on the etch stop layer 118 to fill the trench 112. In example embodiments, the first insulation layer 120 may include, e.g., silicon oxide.

In example embodiments, an upper surface of the first insulation layer 120 may be planarized, after forming the first insulation layer 120. In an example embodiment, the upper surface of the first insulation layer 120 may be planarized for a subsequent process such as a CMP (chemical mechanical polishing) or an etch back process. In this case, the planarized upper surface of the first insulation layer 120 may cover the etch stop layer 118 on an upper surface of the conductive pattern structure 110.

Figure 12:
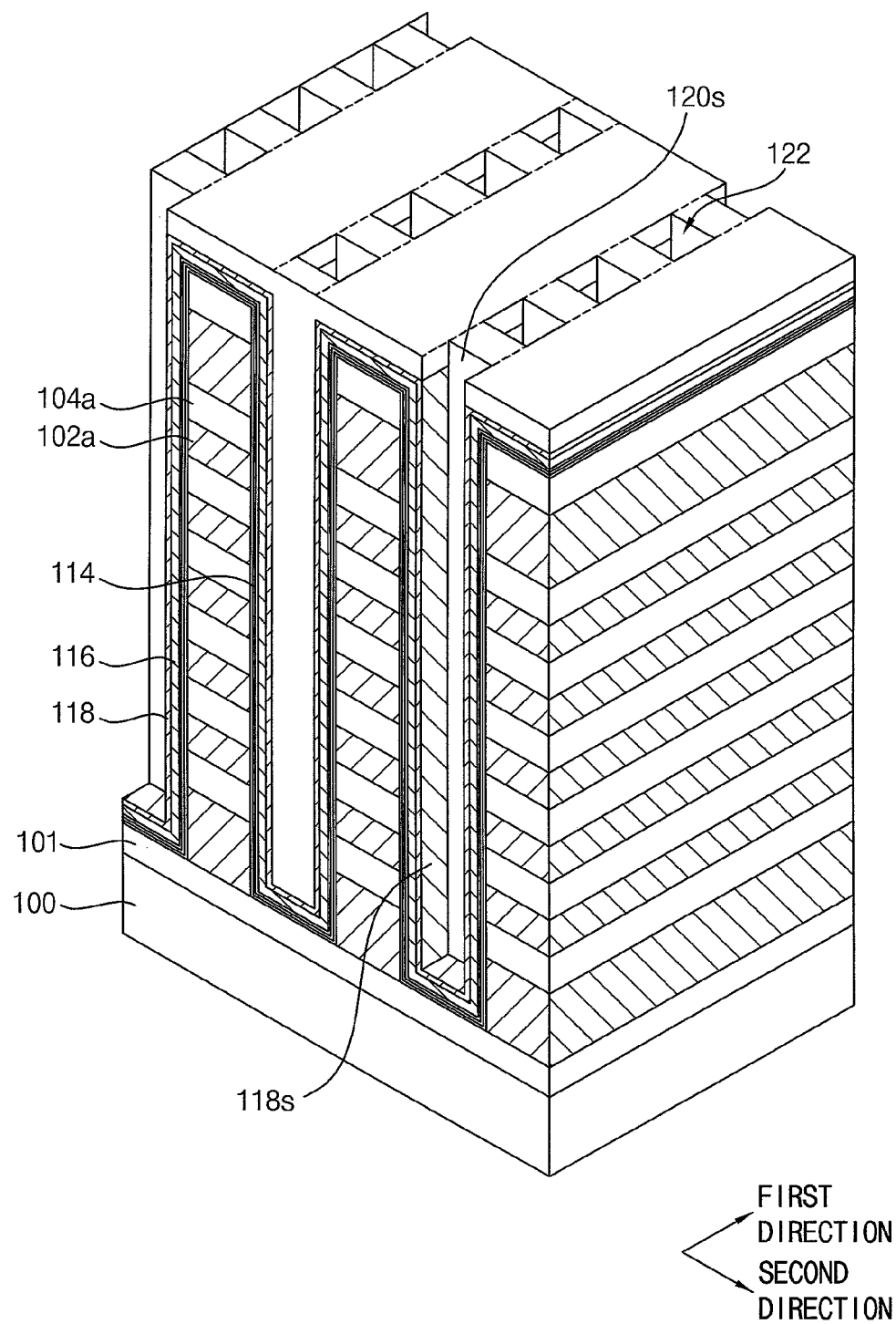
Figure 13:
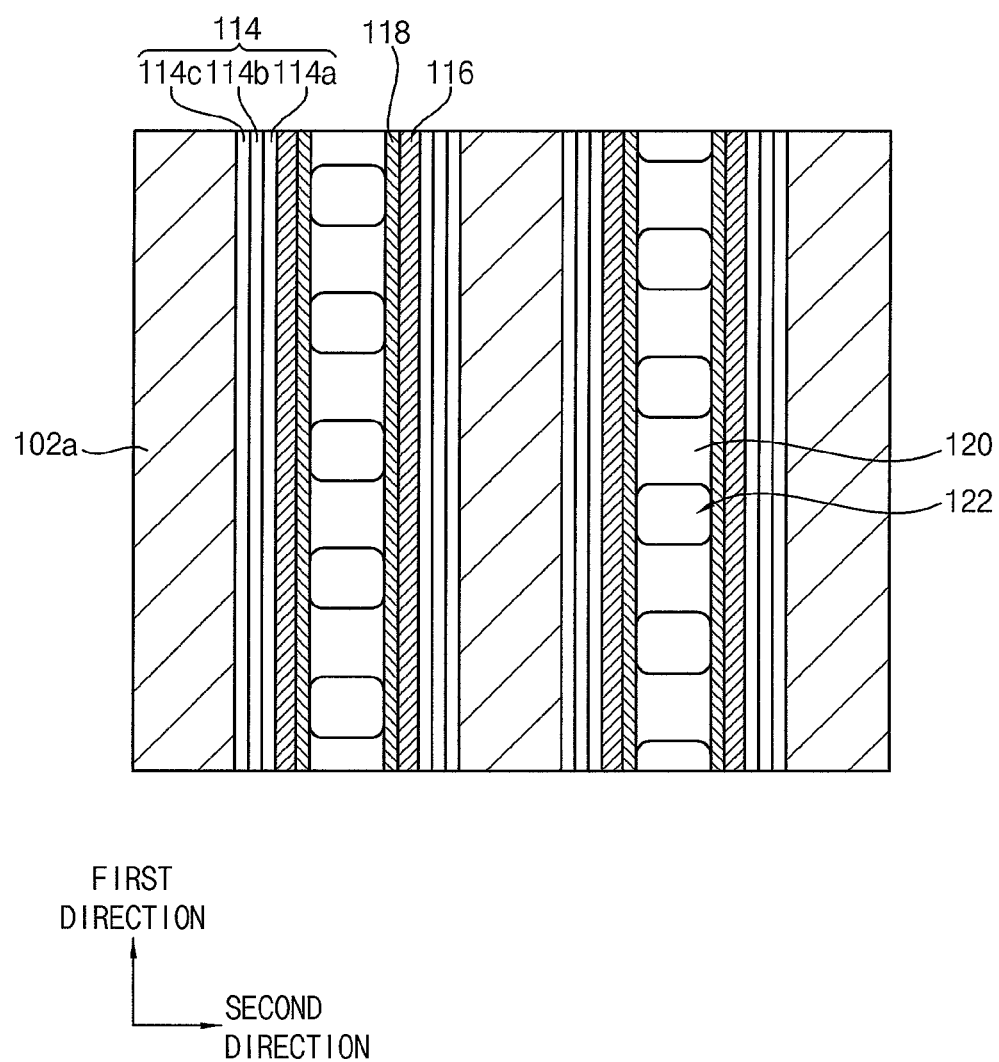

Referring to FIGS. 12 and 13, an etch mask may be formed on the first insulation layer 120. The first insulation layer 120 may be etched to form first holes 122. The first insulation layer 120 may be referred to as a preliminary first insulation layer 120. In an example embodiment, the preliminary first insulation layer 120 may be patterned into a first insulation layer 120 including the first holes.

In this case, the first insulation layer 120 may be etched using the etch stop layer 118. That is, the first insulation layer 120 may be etched so that the etch stop layer 118 may be exposed. Thus, the etch stop layer 118 may be exposed at sidewalls in the second direction and bottoms of the first holes 122. Also, the first insulation layer 120 may be exposed at sidewalls in the first direction of the first holes 122. For example, the first holes 122 may be extended in a third direction perpendicular to an upper surface of the substrate 100 to expose a sidewall 118S of the etch stop layer 118 and a sidewall 120S of the first insulation layer 120. The sidewall 118S and the sidewall 120S may correspond to sidewalls of each of the first holes 122.

The first holes 122 may be disposed in the trench 112. Also, the first holes 122 may be repeatedly arranged to be spaced apart from each other in the first direction.

In example embodiments, the first holes 122 may be arranged in a zig-zag fashion in the second direction. In some example embodiments, the first holes 122 may be arranged in parallel in the second direction.

Figure 14:
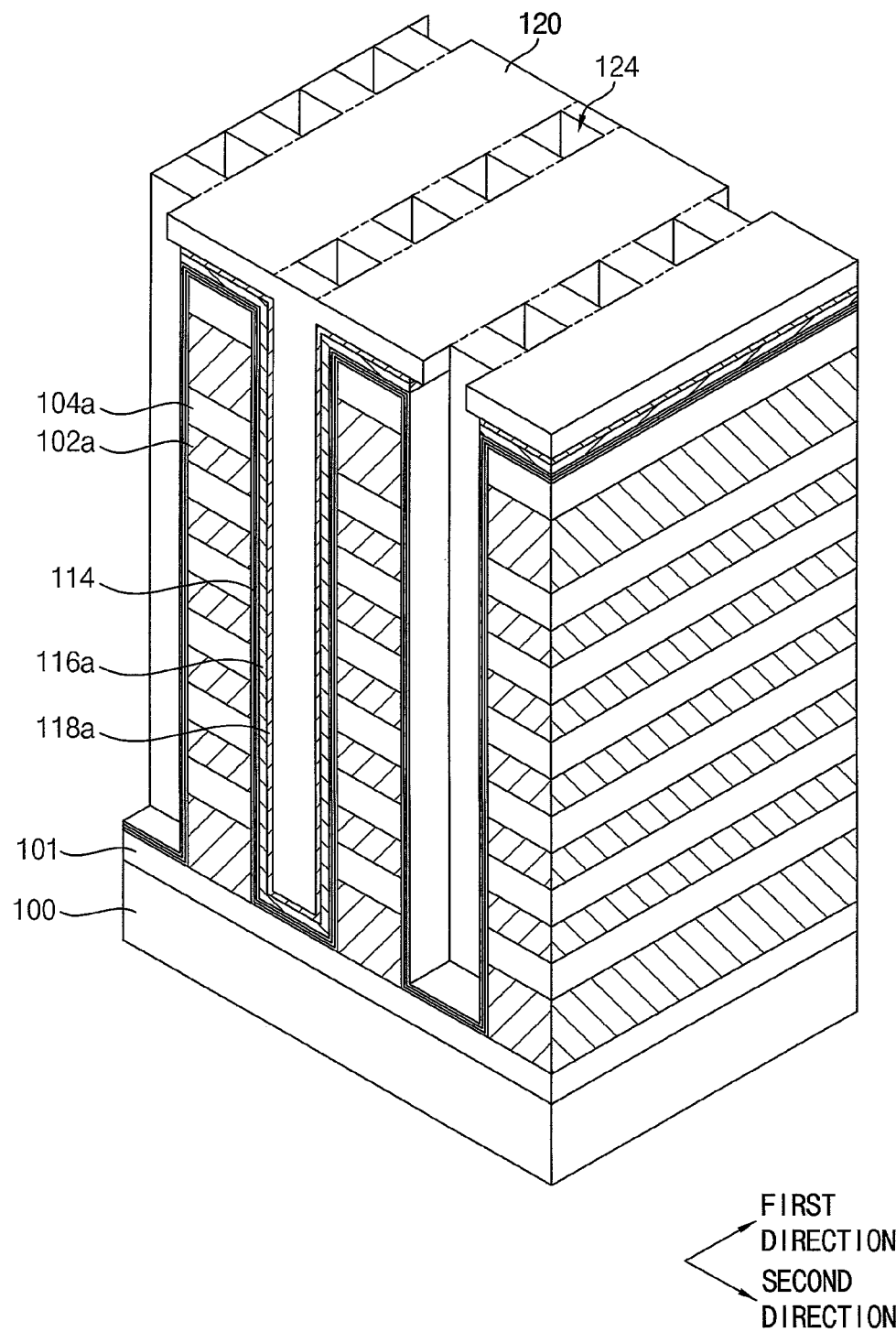
Figure 15:
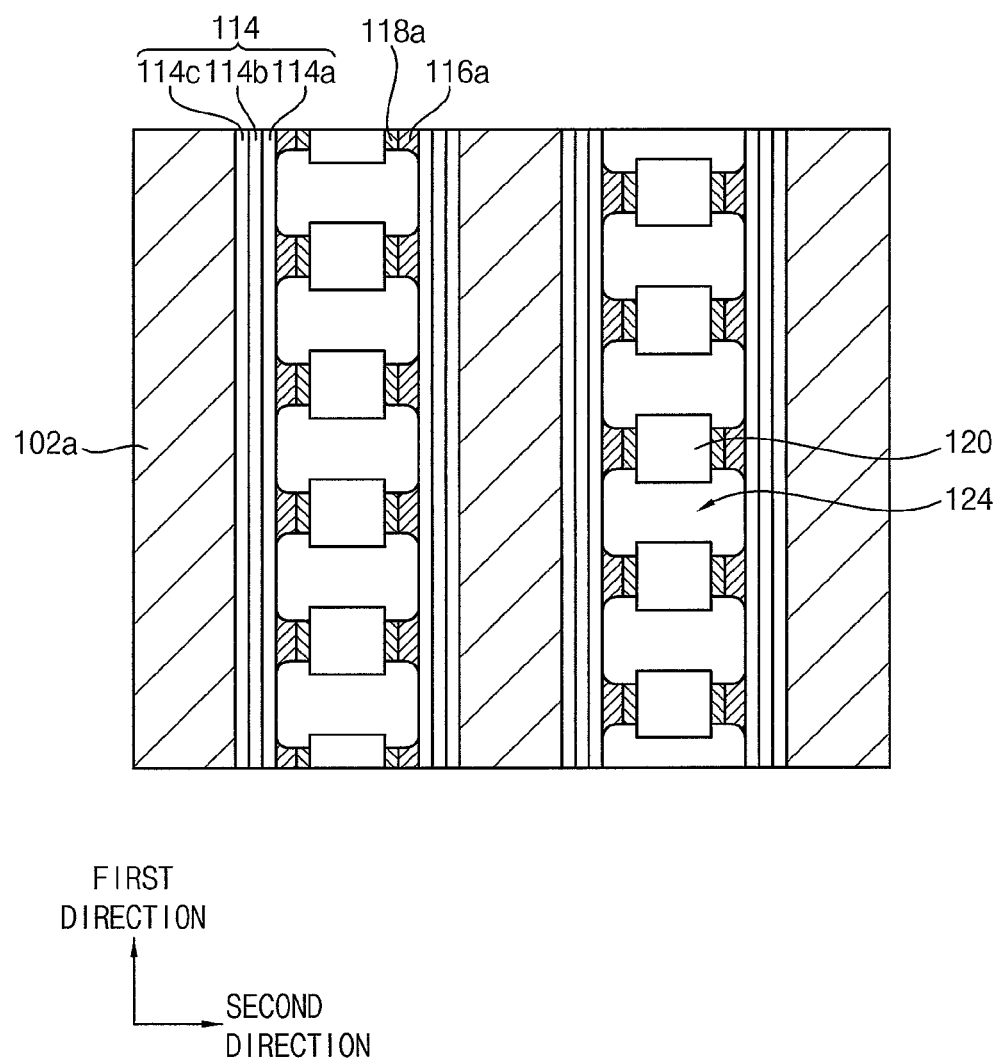

Referring to FIGS. 14 and 15, the etch stop layer 118 exposed by the first holes 122 may be wet etched, and then the channel layer 116 may be etched by a wet etching process to form second holes 124 having an inner portion greater than an inner portion of the first holes 122.

The etch stop layer 118 may be etched using an etchant mixed with ammonium fluoride and hydrofluoric acid, e.g., LAL or an etchant including phosphoric acid. Also, an etch rate and an etching selectivity may be controlled by a temperature condition and compositions of the etchant.

By forming the second holes 124, portions of the etch stop layer 118 and the channel layer 116 may be removed to form etch stop layer patterns 118a and channel patterns 116a. In example embodiments, the tunnel insulation layer 114a may be exposed at sidewalls in the second direction of the second holes 124. In the wet etching process, the first insulation layer 120 may not be etched.

The etch stop layer patterns 118a disposed in the trench 112 may be spaced apart from each other in the first direction. Also, the channel patterns 116a disposed in the trench 112 may be spaced apart from each other in the first direction. In an example embodiment, the etch stop layer patterns 118a disposed in the trench 112 and the channel patterns 116a disposed in the trench 112 may be protected by the first insulation layer 120 in the wet etching for the forming the second holes 124. Thus, each of the etch stop layer patterns 118a disposed in the trench 112 and the channel patterns 116a disposed in the trench 112 may be separated into a plurality of islands by the second holes 124. The plurality of islands may be spaced apart from each other in the first direction. In an example embodiment, the etch stop layer patterns 118a disposed on the upper surface of the conductive pattern structure 110 may be continuously formed, and the channel patterns 116a disposed on the upper surface of the conductive pattern structure 110 may be continuously formed.

When the wet etching process is performed, the etch stop layer 118 and the channel layer 116 may be etched in each of the first and second directions. Thus, a width in the first direction of an etched portion of the etch stop layer 118 and the channel layer 116 may be greater than a width in the first direction of an etched portion of the first insulation layer, i.e., a portion of the first hole. That is, in the second holes 124, a width in the first direction of an edge portion in the second direction may be greater than a width in the first direction of a central portion of the second direction. Also, in the second holes 124, both ends in the first direction of the edge portion in the second direction may have rounded shapes.

When the channel layer is dry-etched to form a channel pattern, etch damage, e.g., plasma damage, of the channel pattern may occur. Thus, memory cells subsequently formed may not have normal electrical characteristics.

However, as described above, the channel pattern 116a may be formed by the wet etching process. Thus, when the channel pattern 116a is formed, plasma damages may not occur. Also, a variation of electrical characteristics of the memory cells due to the plasma damages of the channel pattern 116a may not be generated.

Figure 16:
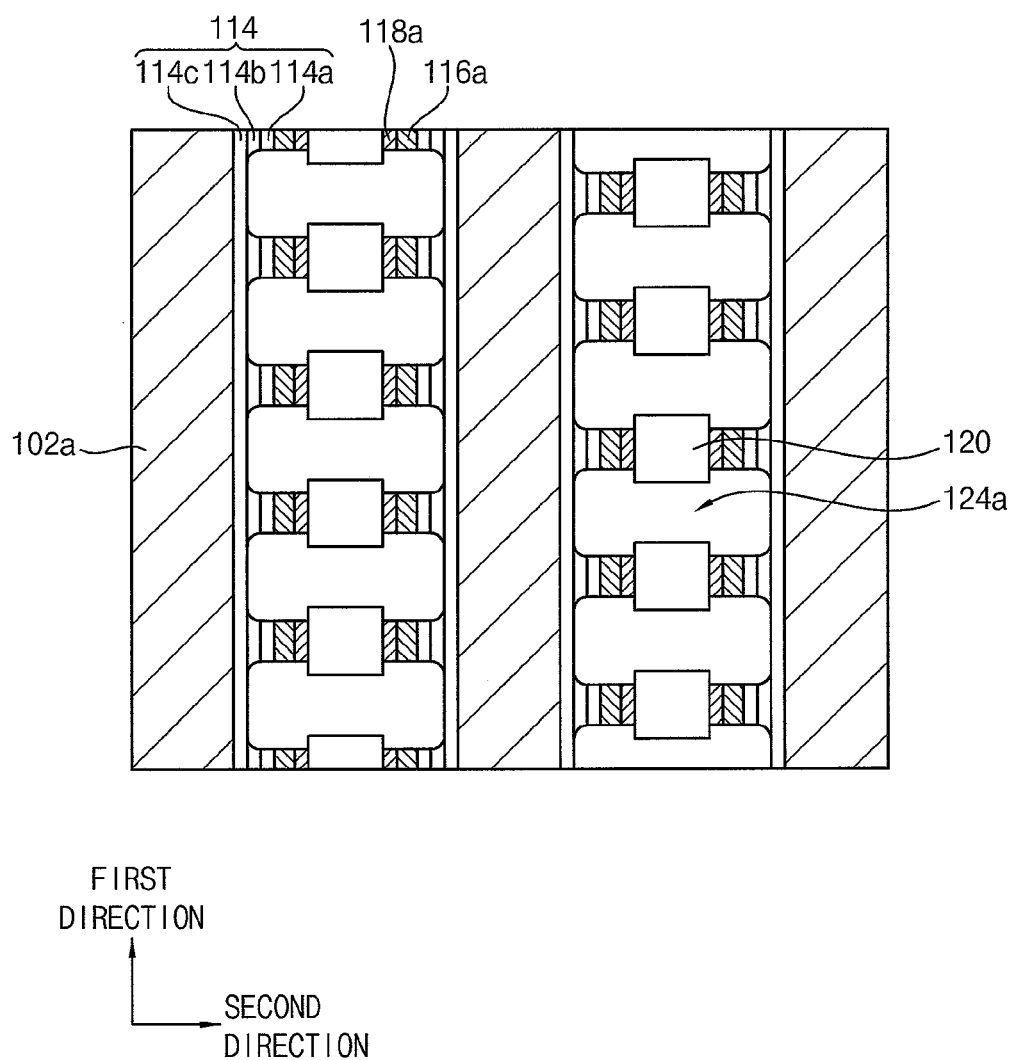

Referring to FIG. 16, the tunnel insulation layer 114a exposed by the sidewalls of the second holes 124 may be etched by a wet etching process, and then the charge storage layer 114b may be etched by a wet etching process. Thus, third holes 124a may be formed to have an inner portion greater than the inner portion of the second holes 124. A blocking dielectric layer 114c may be exposed at sidewalls of the third holes 124a that are opposite each other in the second direction.

The tunnel insulation layer 114a and the charge storage layer 114b may be patterned by forming the third holes 124a. For example, each of the tunnel insulation layer 114a and the charge storage layer 114b may be disposed in the trench 112 and may be patterned by the third holes 124a into a plurality of islands spaced apart from each other in the first direction. Thus, the tunnel insulation layer 114a in the trench 112 may be spaced apart from each other in the first direction, and the charge storage layer 114b in the trench 112 may be spaced apart from each other in the first direction.

Similar to the second holes 124, in the third holes 124a, a width in the first direction of an edge portion in the second direction may be greater than a width in the first direction of a central portion of the second direction. Also, in the third holes 124a, both ends in the first direction of the edge portion in the second direction may have rounded shape. In an example embodiment, the third holes 124a may have round corners.

When the tunnel insulation layer 114a is etched, the first insulation layer 120 exposed by the sidewalls of the second holes 124 may be partially etched together.

As the charge storage layers 114b are separated from each other by the wet etching process, each of the memory cells may include a separated charge storage layer 114b. Thus, a disturbance or interference between data stored in the neighboring memory cells may decrease.

In some example embodiments, the wet etch process described with reference to FIG. 16 may not be performed. In this case, as shown in FIG. 15, the channel patterns 116a may be spaced from each other in the first direction, and the memory layer 114 on a sidewall of the trench 112 may be continuously extended in the first direction without cutting portions.

In some example embodiments, the wet etching process may be performed so that only the tunnel insulation layer 114a may be etched. In this case, the tunnel insulation layers 114a may be spaced apart from each other in the first direction, and each of the charge storage layer 114b and the blocking dielectric layer 114c on the sidewall of the trench 112 may be continuously extended without cutting portions.

Figure 17:
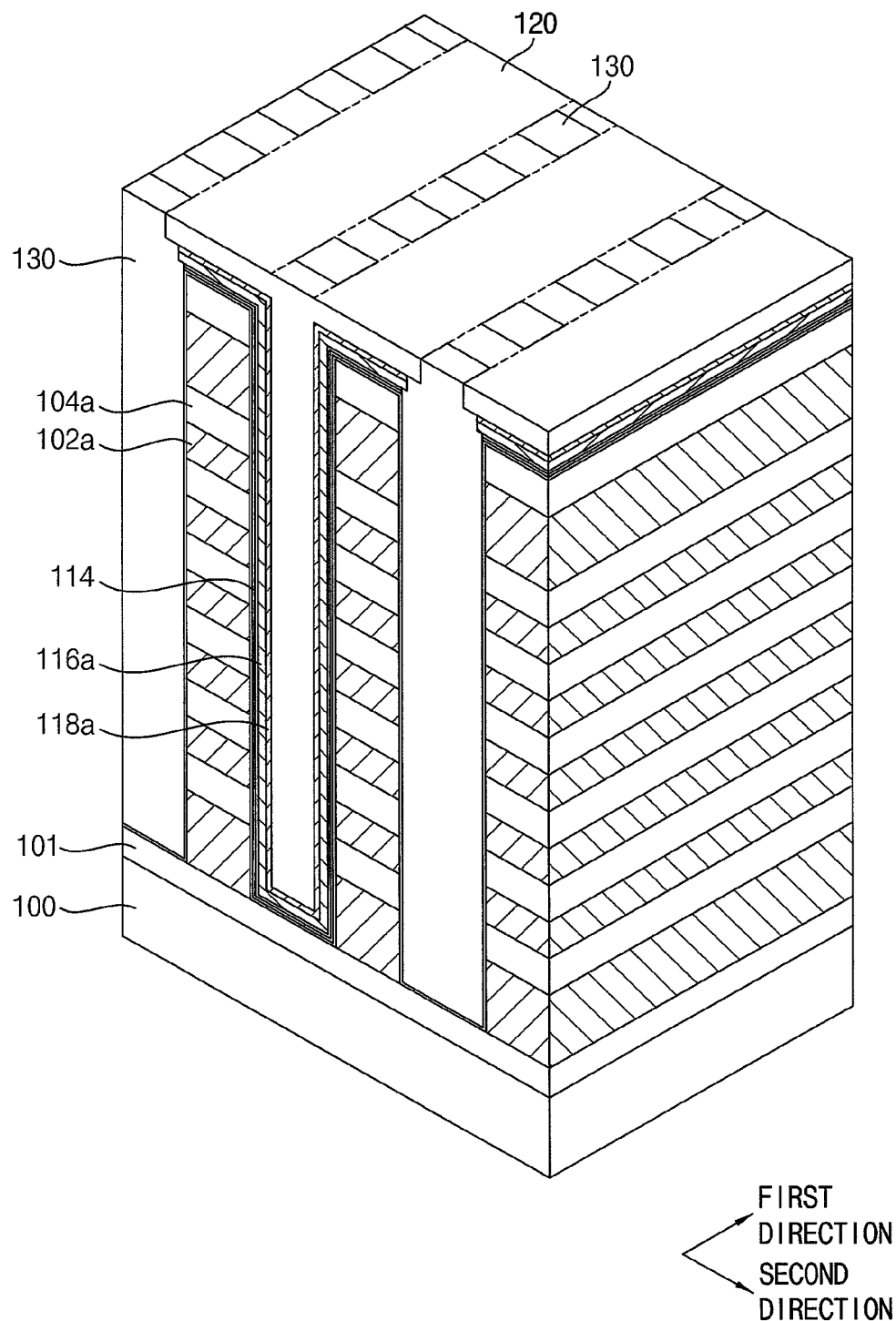

Referring to FIG. 17, a filling insulation pattern 130 may be formed to fill the third holes 124a.

In example embodiments, an insulation layer may be formed to completely fill the third holes 124a. An upper surface of the insulation layer may be planarized to form the filling insulation pattern 130.

In example embodiments, the filling insulation pattern 130 may include a material the same as a material of the first insulation layer 120. For example, the filling insulation pattern 130 may include, e.g., silicon oxide. In some example embodiments, the filling insulation pattern 130 may include a low-k dielectric layer having a dielectric constant lower than a dielectric constant of the silicon oxide.

In example embodiments, the first insulation layer 120 may remain on an upper surface of the conductive pattern structure 110, after forming the filling insulation pattern 130. In this case, the insulation layer may be planarized to form the filling insulation pattern 130 until the upper surface of the first insulation layer 120 is exposed. In some example embodiments, the etch stop layer pattern 118a may be exposed, after a planarization process for forming the filling insulation pattern 130. For example, the insulation layer may be planarized to form the filling insulation pattern 130 until the etch stop layer pattern 118a that is disposed on the upper surface of the conductive pattern structure 110 is exposed. In this case, the first insulation layer 120 formed on the upper surface of the conductive pattern structure 110 may be removed by the planarization process.

Figure 18:
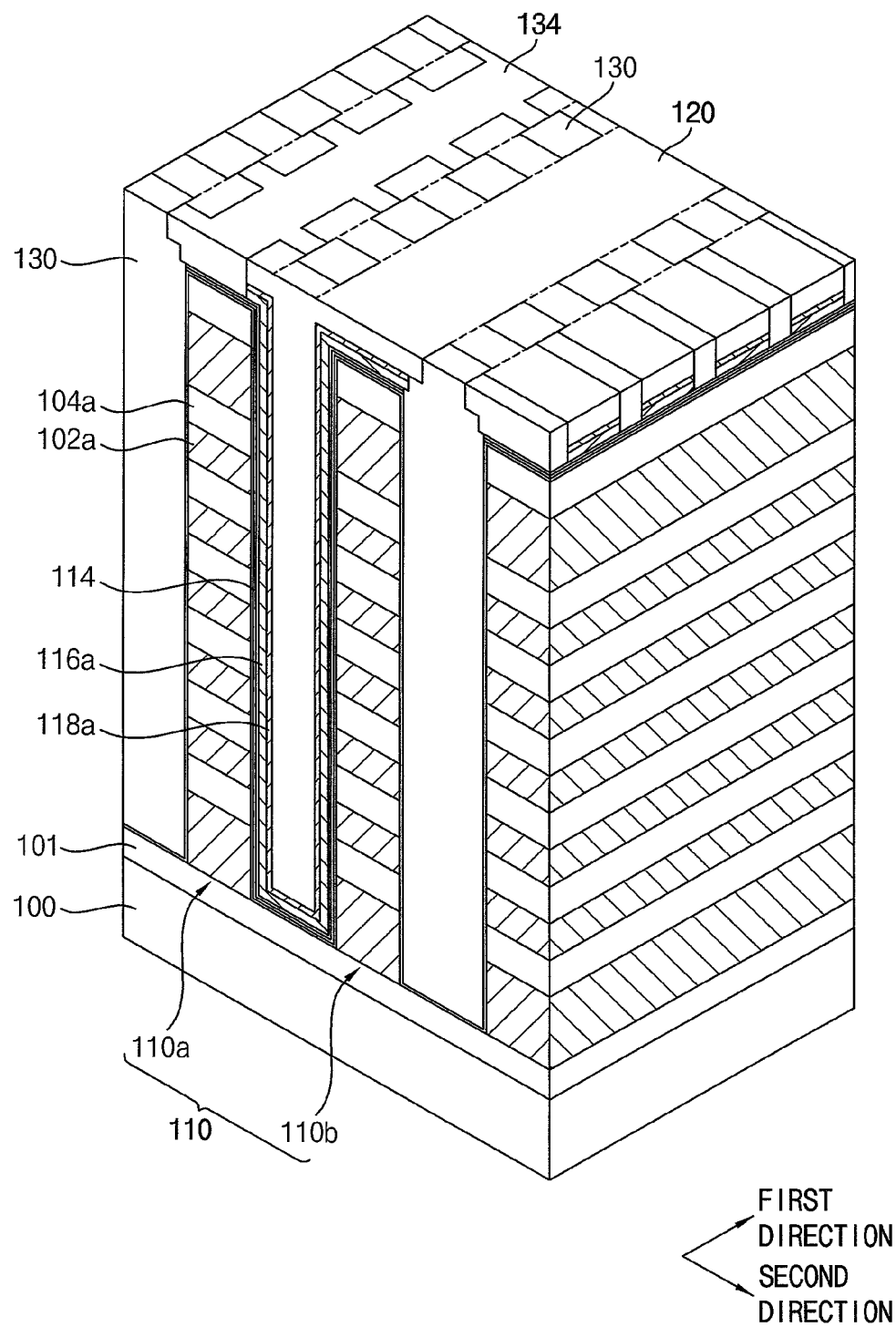

Referring to FIG. 18, portions of the first insulation layer 120, the etch stop layer pattern 118a, and the channel pattern 116a formed on the upper surface of the conductive pattern structure 110 may be etched. Then, the upper insulation layer 134 may be formed to fill etched portions.

Thus, in a cross-sectional view, the channel pattern 116a between the neighboring conductive pattern structures 110 may have a U-shape. The neighboring conductive pattern structures 110 are referred to as a first conductive pattern structure 110a and a second conductive pattern structure 110b, respectively.

In example embodiments, the first insulation layer 120, the etch stop layer pattern 118a and the channel pattern 116a may be etched so that the channel pattern 116a formed on the upper surface of the first conductive pattern structure 110a may be separated from each other in the first and second directions. Thus, the channel patterns 116a formed on the upper surface of the first conductive pattern structure 110a may be spaced apart in the first direction. Also, the channel patterns 116a formed on the upper surface of the first conductive pattern structure 110a may be spaced apart in the second direction.

On the other hand, the channel pattern 116a formed on an upper surface of the second conductive pattern structure 110b may not be etched. Thus, the channel pattern 116a formed on the upper surface of the second conductive pattern structure 110b may have a connected shape in the first direction.

The channel pattern 116a formed on the upper surface of the first conductive pattern structure 110a may be connected to the string selection transistor, and the channel pattern 116a formed on the upper surface of the second conductive pattern structure 110b may be connected to the ground selection transistor.

That is, the cell string may include neighboring first and second conductive pattern structures 110a and 110b, the channel pattern having the U-shape and memory layer formed between the first and second conductive pattern structures 110a and 110b. Also, the conductive patterns 102a included in the first and second conductive pattern structures 110a and 110b may serve as gate electrodes of the transistors included in the cell string.

Although not shown, each of the channel patterns 116a formed on the upper surface of the first conductive pattern structure 110a may be connected to a bit line contact and a bit line. The bit line may extend in the second direction. Also, the channel pattern 116a formed on the upper surface of the second conductive pattern structure 110b may be connected to a ground contact and a ground line.

As described above, the etch stop layer 118 may be formed in the trench 112 between the neighboring first and second conductive pattern structures 110a and 110b. Thus, in processes for forming the channel pattern 116a, first, the dry etching process may be performed to expose the etch stop layer 118. Thereafter, the etch stop layer 118 and layers covered by the etch stop layer 118 may be removed by the wet etching process, so that the plasma damage due to the etching process may decrease.

Figure 19:
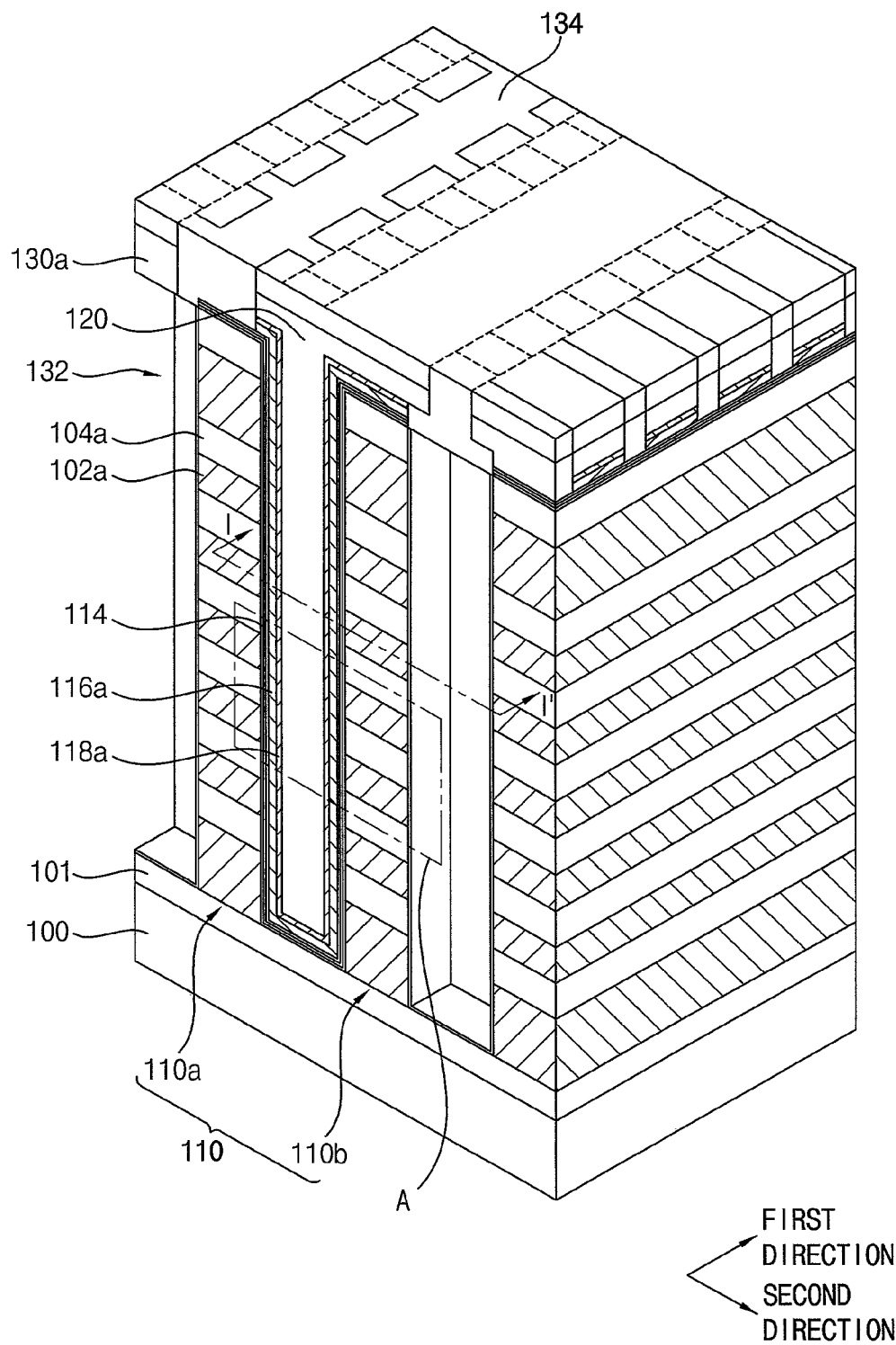

FIG. 19 is a perspective view illustrating a vertical semiconductor device in accordance with example embodiments.

The vertical semiconductor device of FIG. 19 may be substantially the same as or similar to that illustrated in FIG. 1, except for an upper insulation pattern.

In example embodiments, a plan view taken along line I-I' of FIG. 19 may be substantially the same as one of FIGS. 2 and 4. A cross-sectional view of an "A" portion of FIG. 19 may be substantially the same as one of FIGS. 3 and 5.

Referring to FIG. 19, the upper insulation pattern 130a may contact upper sidewalls between the pillar structures in the first direction. That is, the upper insulation pattern 130a may be formed only on an upper portion of the trench 112, not completely filling the trench 112. A lower portion of the trench 112 under a bottom of the upper insulation pattern 130a may not be filled with layers.

In example embodiments, the upper insulation pattern 130a may be formed on the first insulation layer 120 disposed on the upper surface of the conductive pattern structure 110.

An air gap 132 remaining as an empty space may be formed in the trench 112 under the bottom of the upper insulation pattern 130a. Therefore, a parasitic capacitance between adjacent conductive patterns in the first direction may decrease, so that a disturbance or interference between the memory cell strings may decrease. The term "air" as discussed herein, may refer to atmospheric air, or other gases that may be present during the manufacturing process.

Figure 20:
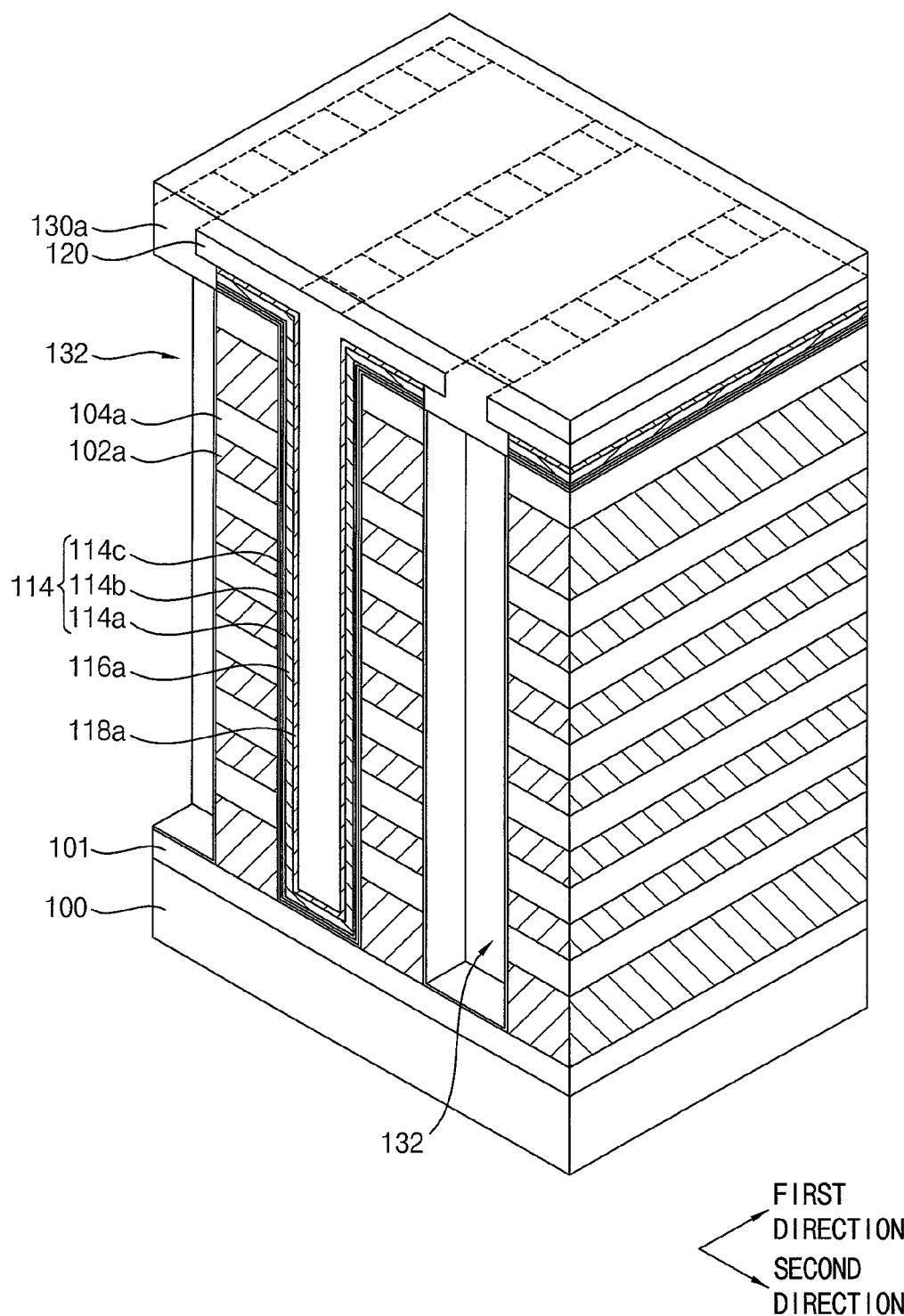

FIG. 20 is a perspective view illustrating stages of a method of manufacturing a vertical semiconductor device in accordance with example embodiments.

The method of manufacturing the vertical semiconductor device may be the same as the method described with reference to FIGS. 6 to 18, except for forming the upper insulation pattern 130a.

Referring to FIG. 20, first, processes substantially the same as or similar to those illustrated with reference to FIGS. 6 to 16 may be performed to form the structure shown in FIG. 16. Then, the upper insulation pattern 130a may be formed on the first insulation layer 120 to fill the upper portions of the third holes 124a. Therefore, the air gap 132 may be formed in the third hole below the upper insulation pattern 130a.

The upper insulation pattern 130a may be formed by deposition process in which a step coverage characteristic is not good. In this case, the upper insulation pattern 130a may not be conformally deposited.

Thereafter, processes illustrated with reference to FIG. 18 may be performed to form the vertical semiconductor device shown in FIG. 19.

Figure 21:
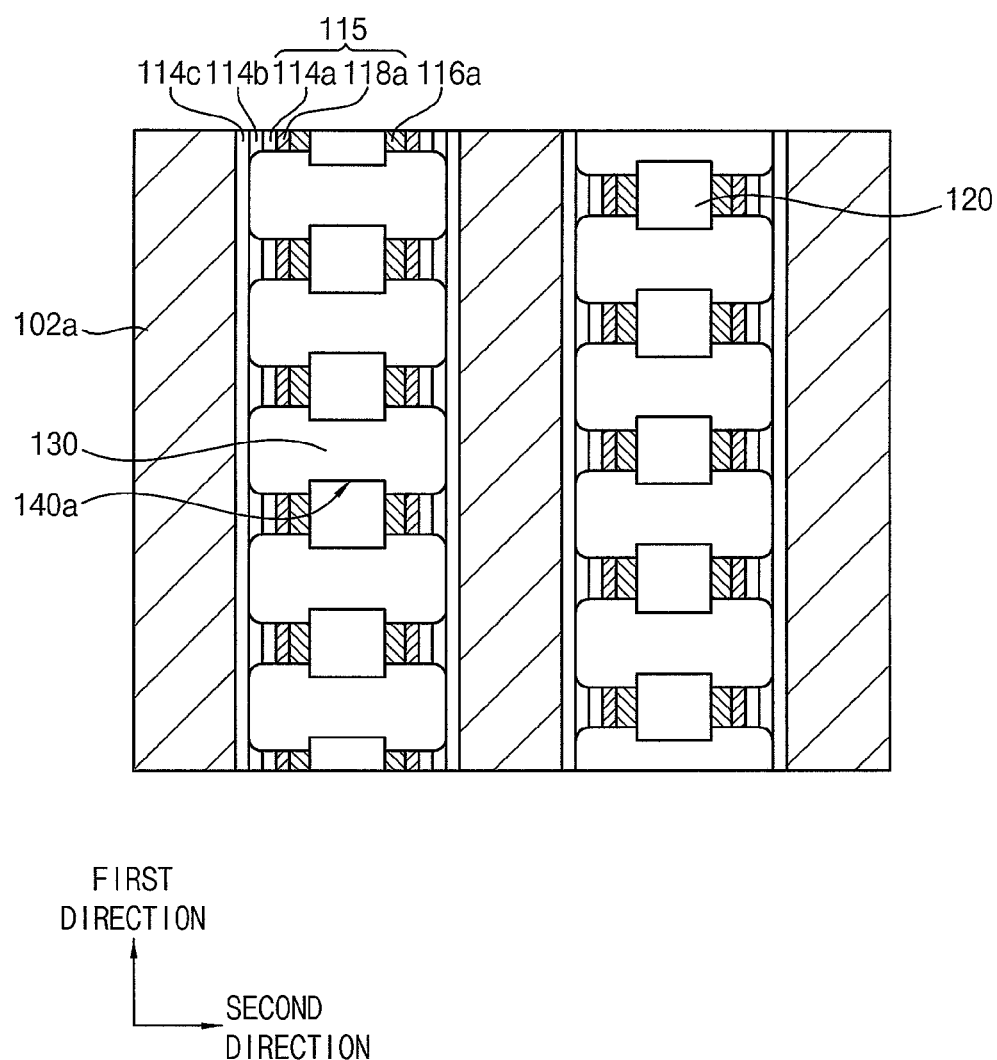
Figure 22:
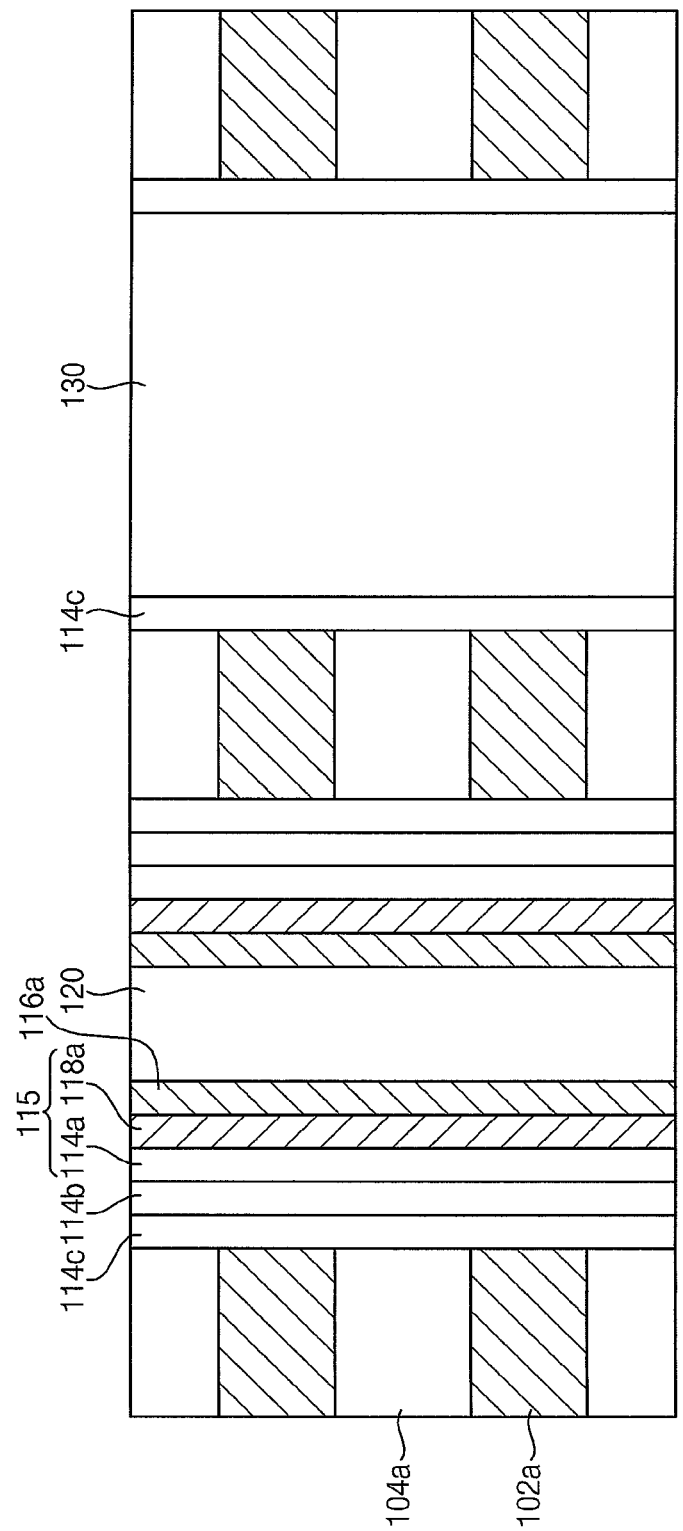

FIGS. 21 and 22 are a plan view and a cross-sectional view illustrating a vertical semiconductor device in accordance with example embodiments, respectively.

The vertical semiconductor device may be substantially the same as or similar to that illustrated in FIGS. 1 to 3, except for a stacked structure of layers included in the memory cell formed on the sidewalls of the trench 112.

FIG. 21 is a plan view of a portion of one conductive pattern cut in the horizontal direction, and FIG. 22 is a cross-sectional view of the vertical semiconductor device cut in the second direction.

Referring to FIGS. 21 and 22, the blocking dielectric layer 114c, the charge storage layer 114b, the tunnel insulation layer 114a, the etch stop layer pattern 118a, the channel pattern 116a and a first insulation layer 120 may be sequentially formed on sidewalls of the trench 112 for forming the memory cell.

The etch stop layer pattern 118a and the tunnel insulation layer 114a may be formed on the channel pattern 116a so that a stacked structure 115 including the etch stop layer pattern 118a and the tunnel insulation layer 114a may serve as a tunnel layer of the cell transistor. Thus, the etch stop layer pattern 118a may include an insulation material that may be used as a portion of a tunnel layer of the cell transistor. Also, the etch stop layer pattern 118a may have a tunnel barrier condition (i.e., a work function condition) so that the cell transistor may have a target threshold voltage.

The etch stop layer pattern 118a may include a material having a high etching selectivity with respect to the channel pattern 116a, in a dry etching process. That is, when the channel layer is dry etched to form the channel pattern 116a, the etch stop layer pattern 118a may be hardly etched. In an example embodiment, the channel pattern 116a may include polysilicon. For example, the etch stop layer pattern 118a may include a material that may be hardly etched in a dry etching process of polysilicon.

Also, the etch stop layer pattern 118a may include a material that may be easily removed by a wet etching process. When a material included in the etch stop layer pattern 118a is wet etched, at least the channel pattern 116a may not be etched. Therefore, in the wet etching process, the etch stop layer pattern 118a and the channel pattern 116a may have a high etching selectivity to each other.

For example, the etch stop layer pattern 118a may include a material, e.g., aluminum oxide, aluminum nitride, silicon nitride, etc.

The filling insulation pattern 130 may be interposed between the channel patterns 116a in the first direction. That is, the channel patterns 116a may be spaced apart from each other by the filling insulation pattern 130.

In example embodiments, both sides of the filling insulation pattern 130 in the second direction may contact the blocking dielectric layer 114c. In this case, the blocking dielectric layer 114c may be continuously formed on the sidewall of the conductive pattern structure 110. The tunnel insulation layer 114a on the sidewall of the conductive pattern structure 110 may be spaced apart from each other in the first direction, and the charge storage layer 114b on the sidewall of the conductive pattern structure 110 may be spaced apart from each other in the first direction. Thus, the filling insulation pattern 130 and a portion of the blocking dielectric layer 114c may be formed between the memory cells in the trench 112. In an example embodiment, the filling insulation pattern 130 may contact the portion of the blocking dielectric layer 114c.

In some example embodiments, both sides of the filling insulation pattern 130 in the second direction may contact the tunnel insulation layer 114a.

In some example embodiments, both sides of the filling insulation pattern 130 in the second direction may contact the charge storage layer 114b.

In some example embodiments, both sides of the filling insulation pattern 130 in the second direction may contact the etch stop layer. In this case, the etch stop layer may not be patterned so that etch stop layer may cover the sidewall of the conductive pattern structure 110.

FIGS. 23 to 26 are plan views illustrating stages of a method of manufacturing a vertical semiconductor device in accordance with example embodiments.

FIGS. 23 to 26 show a portion of one conductive pattern cut in the horizontal direction.

First, the conductive pattern structures 110 may be formed by performing the same processes as those illustrated with reference to FIGS. 6 to 8.

Figure 23:
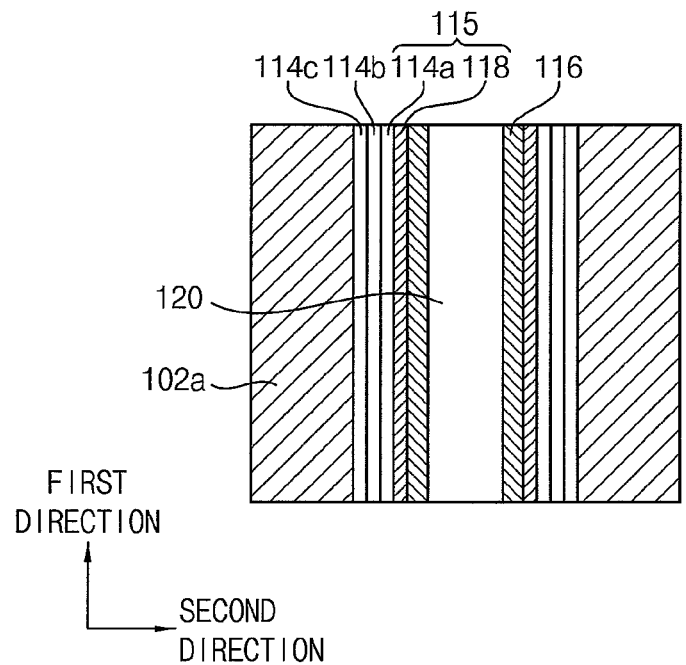

Referring to FIG. 23, the blocking dielectric layer 114c, the charge storage layer 114b, and the tunnel insulation layer 114a may be formed on surfaces of the conductive pattern structure 110 and the lower insulation layer 101. Also, the etch stop layer 118 and the channel layer 116 may be formed on the tunnel insulation layer 114a. The first insulation layer 120 may be formed on the channel layer 116 to fill the trench 112.

Figure 24:
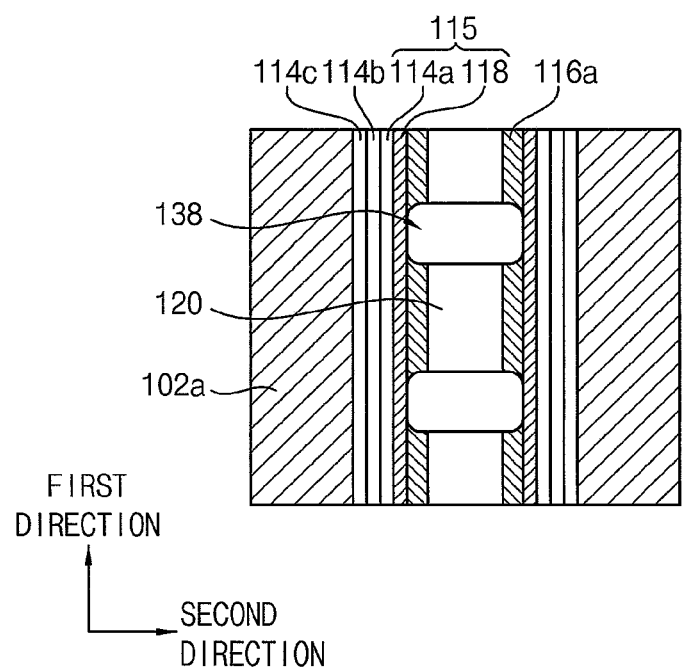

Referring to FIG. 24, an etch mask may be formed on the first insulation layer 120. The first insulation layer 120 and the channel layer 116 may be dry-etched to form the first holes 138.

When the dry etching process is performed, the etch stop layer 118 may be used as a stop layer. Thus, the etch stop layer 118 may be exposed by the sidewalls in the second direction of the first holes 138. As the first holes 138 are formed, the channel layer 116 may be patterned to form a channel pattern 116a.

Figure 25:
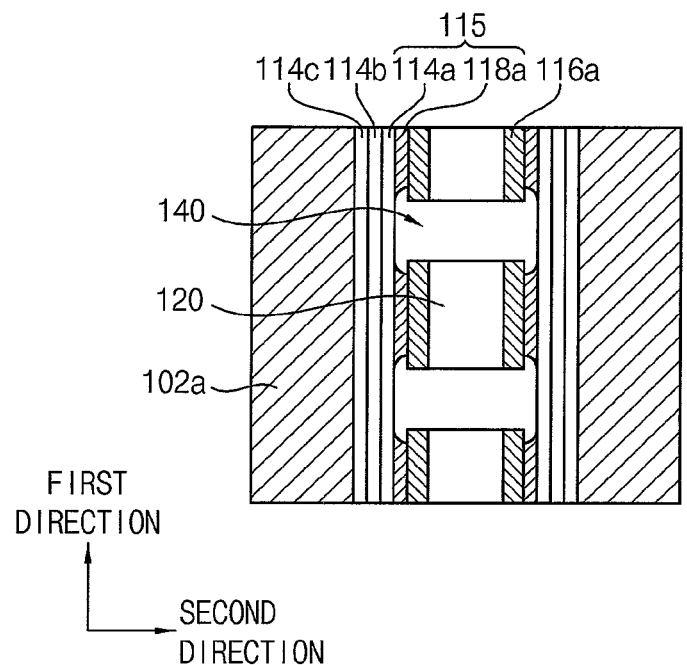

Referring to FIG. 25, the etch stop layer 118 exposed by the sidewalls of the first holes 138 may be etched by a wet etching process to form the second holes 140. Therefore, the tunnel insulation layer 114a may be exposed by sidewalls of the second holes 140. Also, the etch stop layer 118 may be patterned to form the etch stop layer pattern 118a.

Figure 26:
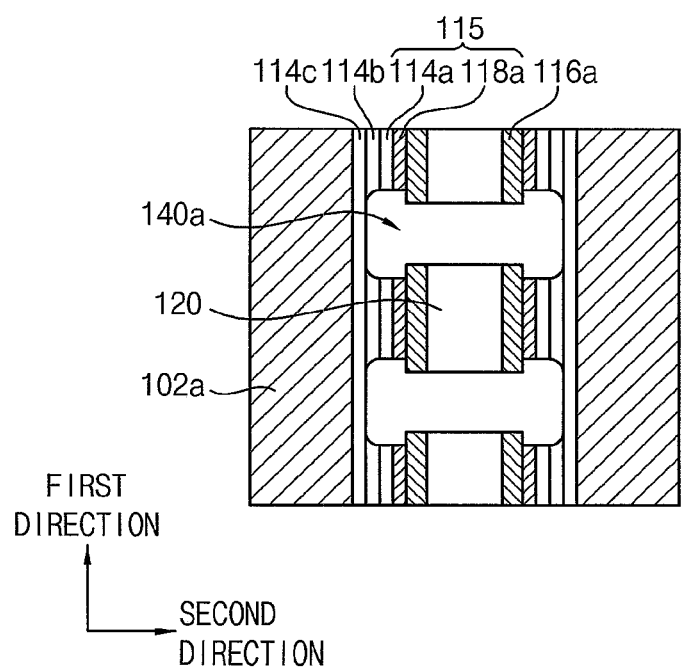

Referring to FIG. 26, the tunnel insulation layer 114a exposed by the sidewalls of the second holes 140 may be etched by a wet etching process, and then the charge storage layer 114b may be etched by a wet etching process. For example, each of the tunnel insulation layer 114a and the charge storage layer 114b may be patterned into a plurality of islands that are spaced apart from each other in the first direction and disposed in the trench 112. Thus, the third holes 140a may be formed to have an inner portion greater than an inner portion of the second holes 140. A blocking dielectric layer 114c may be exposed by sidewalls in the second direction of the third holes 140a.

As described above, the etch stop layer 118, the tunnel insulation layer 114a, and/or the charge storage layer 114b may be etched by the wet etching process to form memory cells without plasma damages.

Also, in the etching processes for forming the holes, the channel layer may be patterned to form the channel pattern 116a.

Therefore, in some example embodiments, the wet etching process of the etch stop layer 118 may not be performed.

In this case, a plan view of a portion of the vertical semiconductor device may be substantially the same as FIG. 24.

In some example embodiments, the wet etching process of the etch stop layer 118 may be performed, and the wet etching process of the tunnel insulation layer 114a, and/or the charge storage layer 114b may not be performed. In this case, a plan view of a portion of the vertical semiconductor device may be substantially the same as FIG. 25.

Figure 27:
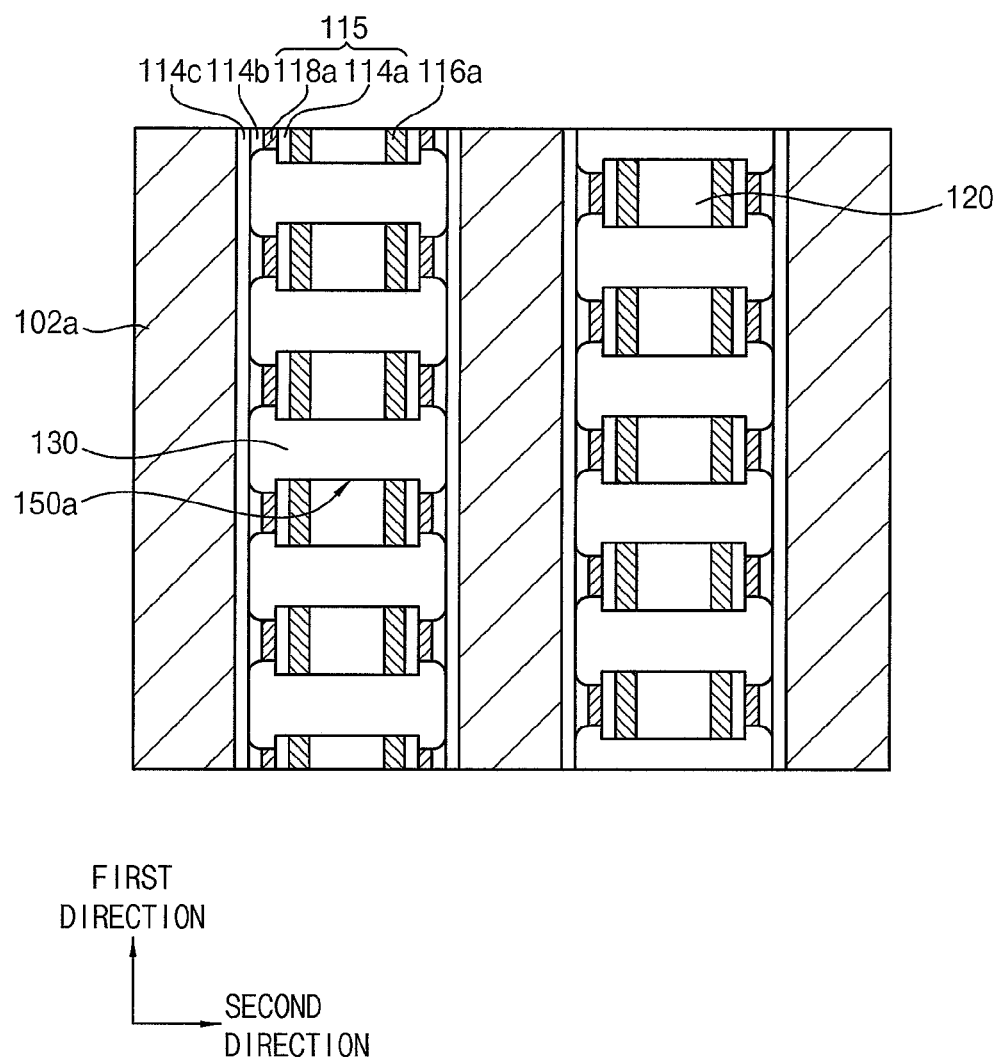
Figure 28:
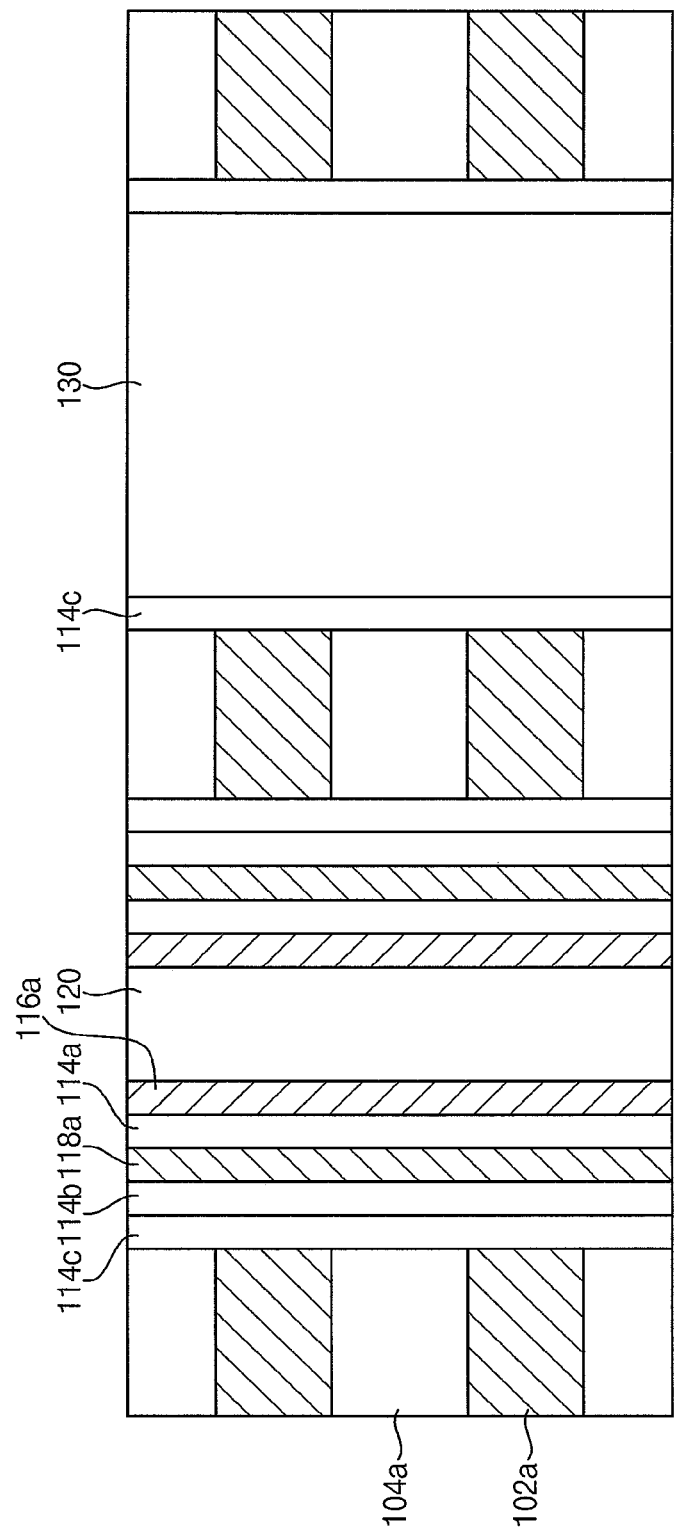

FIGS. 27 and 28 are a plan view and a cross-sectional view illustrating a vertical semiconductor device in accordance with example embodiments.

The vertical semiconductor device may be substantially the same as that illustrated with reference to FIGS. 1 to 3, except for a stacked structure of layers included in the memory cell on the sidewalls of the trench 112.

FIG. 27 is a plan view of a portion of one conductive pattern cut in the horizontal direction, and FIG. 28 is a cross-sectional view of the vertical semiconductor device cut in the second direction.

Referring to FIGS. 27 and 28, the blocking dielectric layer 114c, the charge storage layer 114b, the etch stop layer pattern 118a, the tunnel insulation layer 114a, the channel pattern 116a and the first insulation layer 120 may be sequentially formed on sidewalls of the trench 112 for forming the memory cell.

In example embodiments, the tunnel insulation layer 114a and the etch stop layer pattern 118a may be formed on the channel pattern 116a so that the stacked structure 115 including the tunnel insulation layer 114a and the etch stop layer pattern 118a may serve as a tunnel layer of the cell transistor. Thus, the etch stop layer pattern 118a may include an insulation material used as a tunnel layer of the cell transistor. Also, the etch stop layer pattern 118a may have a tunnel barrier function (i.e., work function control) so that the cell transistor has a target threshold voltage.

For example, the etch stop layer pattern 118a may include, e.g., aluminum oxide, aluminum nitride, silicon nitride, etc.

In some example embodiments, the tunnel insulation layer 114a may serve as a tunnel layer of the cell transistor, and the stacked structure including the etch stop layer pattern 118a and the charge storage layer 114b may serve as a charge storage structure of the cell transistor.

The etch stop layer pattern 118a may include a material having a high etching selectivity with respect to the tunnel insulation layer 114a, in a dry etching process. In an example embodiment, the tunnel insulation layer 114a may include silicon oxide. For example, the etch stop layer pattern 118a may include a material having a high etching selectivity with respect to silicon oxide, in a dry etching process. That is, when the silicon oxide is dry etched, the etch stop layer pattern may hardly be etched.

Also, the etch stop layer pattern 118a may include a material that may be easily removed by a wet etching process. At least the channel pattern 116a may not be etched when a material included in the etch stop layer pattern 118a is wet etched. In an example embodiment, the channel pattern layer 116 may include polysilicon. Therefore, in the wet etching process, the etch stop layer pattern and the polysilicon may have a high etching selectivity to each other.

The filling insulation pattern 130 may be interposed between stacked structures including the channel patterns 116a and the tunnel insulation layer 114a. That is, the channel patterns 116a may be spaced apart from each other by the filling insulation pattern 130 in the first direction.

Further, the tunnel insulation layers 114a may be spaced apart from each other by the filling insulation pattern 130 in the first direction.

In example embodiments, both sides of the filling insulation pattern 130 in the second direction may contact the blocking dielectric layer 114c. In this case, the blocking dielectric layer 114c may be continuously formed on the sidewall of the conductive pattern structure 110. Stacked structures including the tunnel insulation layer 114a, the etch stop layer pattern 118a, and the charge storage layer 114b formed on the sidewall of the conductive pattern structure 110 may be spaced apart from each other in the first direction.

In some example embodiments, both sides of the filling insulation pattern 130 in the second direction may contact the charge storage layer 114b that may be continuously formed in the trench 112.

In some example embodiments, both sides of the filling insulation pattern 130 in the second direction may contact the etch stop layer that may be continuously formed in the trench 112. In this case, the etch stop layer may not be patterned so that the etch stop layer may cover the sidewall of the conductive pattern structure 110.

FIGS. 29 to 32 are plan views illustrating stages of a method of manufacturing a vertical semiconductor device in accordance with example embodiments.

First, processes illustrated with reference to FIGS. 6 to 8 may be performed to form the conductive pattern structures 110.

Figure 29:
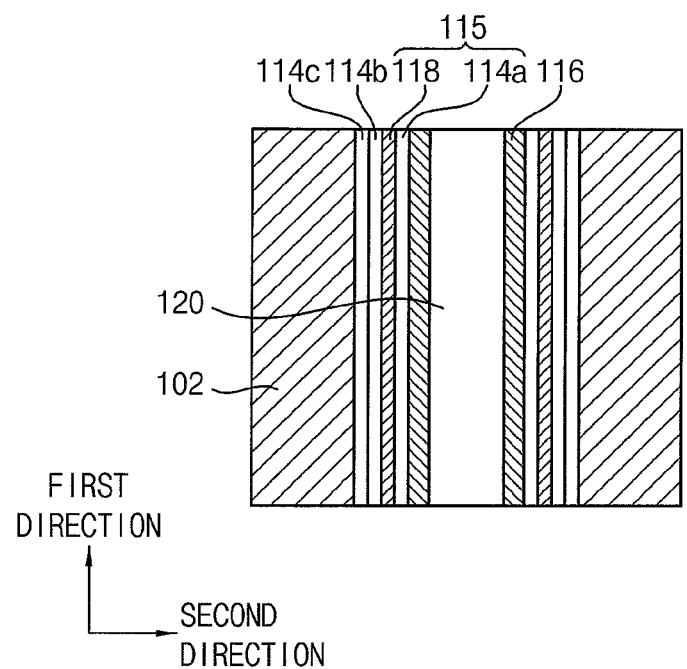

Referring to FIG. 29, the blocking dielectric layer 114c, the charge storage layer 114b, the etch stop layer 118 and the tunnel insulation layer 114a may be formed on surfaces of the conductive pattern structure 110 and the lower insulation layer 101. Also, the channel layer 116 may be formed on the tunnel insulation layer 114a. The first insulation layer 120 may be formed on the channel layer 116 to fill the trench 112.

Figure 30:
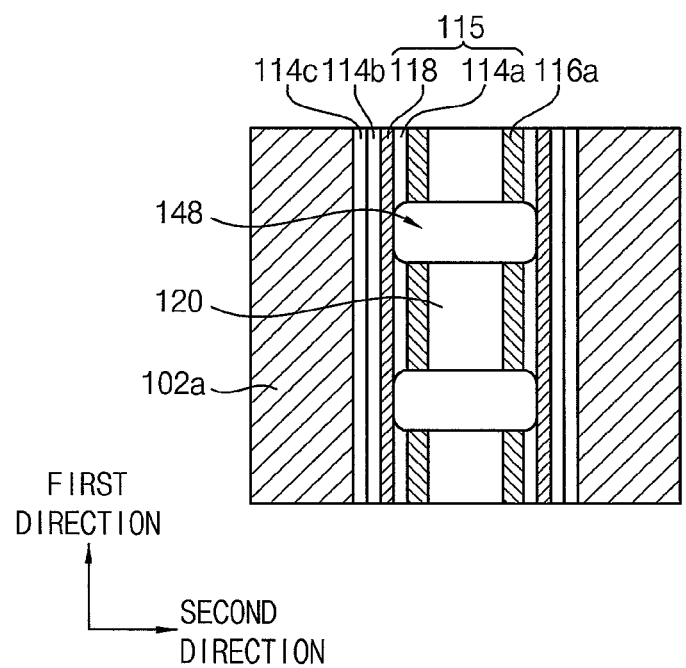

Referring to FIG. 30, an etch mask may be formed on the first insulation layer 120. The first insulation layer 120, the channel layer 116, and the tunnel insulation layer 114a may be dry etched to form the first holes 148.

When the dry etching process is performed, the etch stop layer 118 may be used as a stop layer. Therefore, the etch stop layer 118 may be exposed by the sidewalls of the first holes 148. Also, the channel layer 116 may be patterned to form the channel pattern 116a by the process for forming the first holes 148. Further, the tunnel insulation layer 114a may be patterned.

Figure 31:
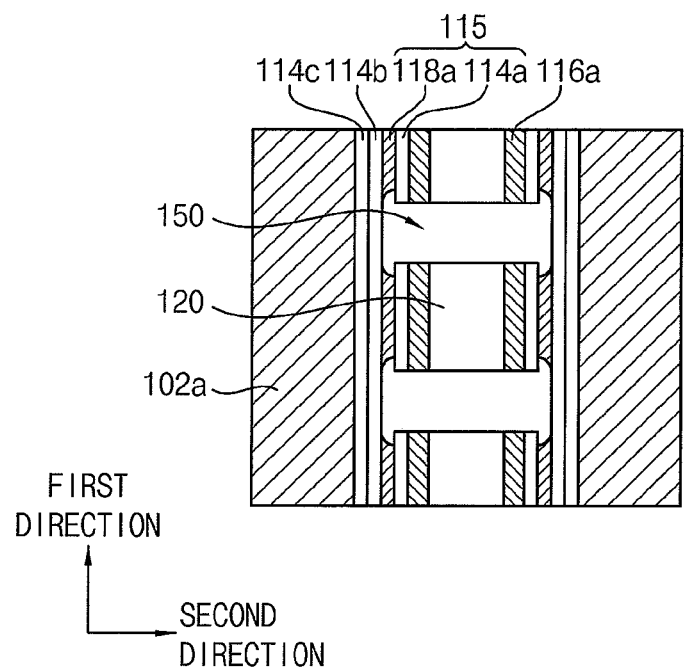

Referring to FIG. 31, the etch stop layer 118 exposed by the sidewalls of the first holes 148 may be etched by a wet etching process to form the second holes 150. Thus, the etch stop layer pattern 118a may be formed. In the wet etching process, an under-cut region may be formed between the etch stop layer pattern 118a and the tunnel insulation layer 114a.

Figure 32:
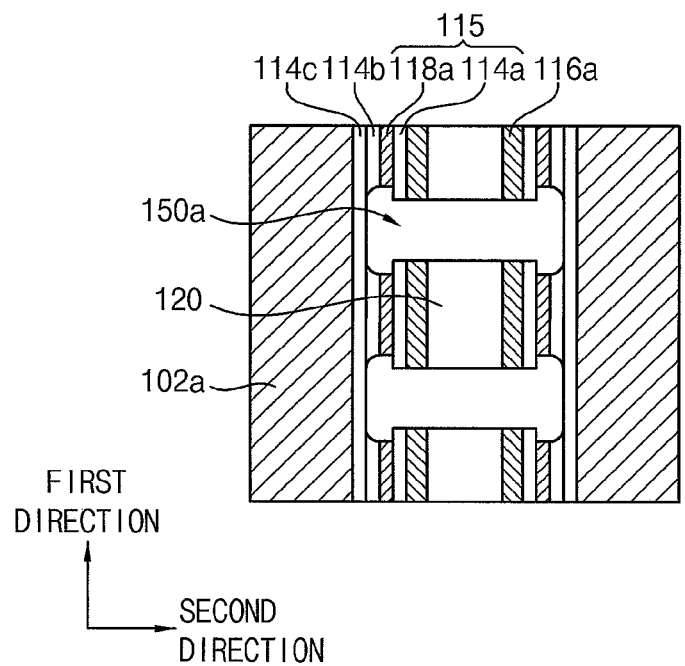

Referring to FIG. 32, the charge storage layer 114b exposed by the sidewalls of the second holes 150 may be etched by a wet etching process to form the third holes 150a. The third holes 150a may have an inner portion greater than an inner portion of the second holes 150. The charge storage layer 114b may be patterned by forming the third holes 150a. The blocking dielectric layer 114c may be exposed by the sidewalls of the third holes 150a. The sidewalls of the third holes 150a may be opposite each other in the second direction.

As described above, the etch stop layer and the charge storage layer may be wet etched, so that memory cells without plasma damages may be formed.

In example embodiments, the channel layer 116 may be patterned to form the channel pattern 116a at least by the processes for forming the first holes 148.

Thus, in some example embodiments, the wet etching process of the etch stop layer 118 may not be performed. In this case, a plan view of the vertical semiconductor device may be substantially the same as one of FIG. 30.

In some example embodiments, the wet etching process of the etch stop layer 118 may be performed, and the wet etching process of the charge storage layer 114b may not be performed. In this case, a plan view of the vertical semiconductor device may be substantially the same as one of FIG. 31.

Figure 33:
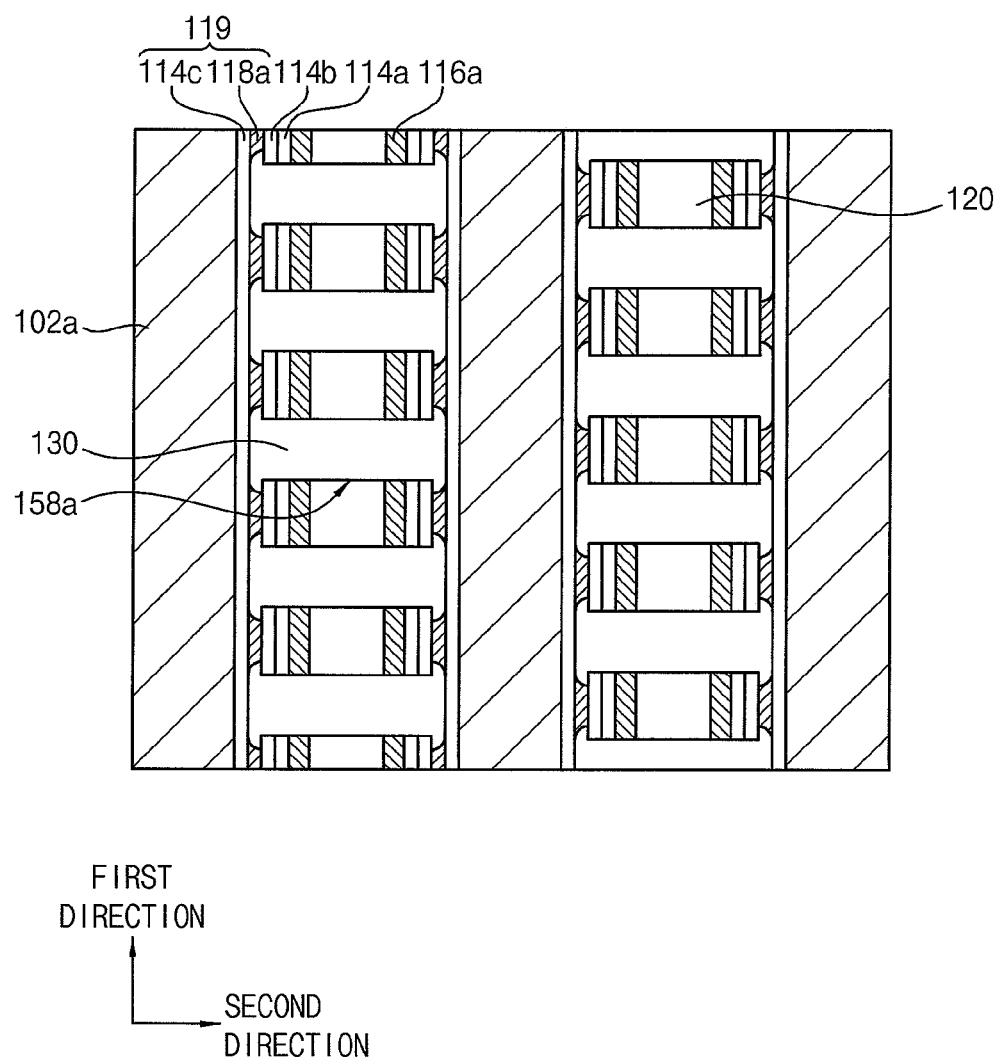
Figure 34:
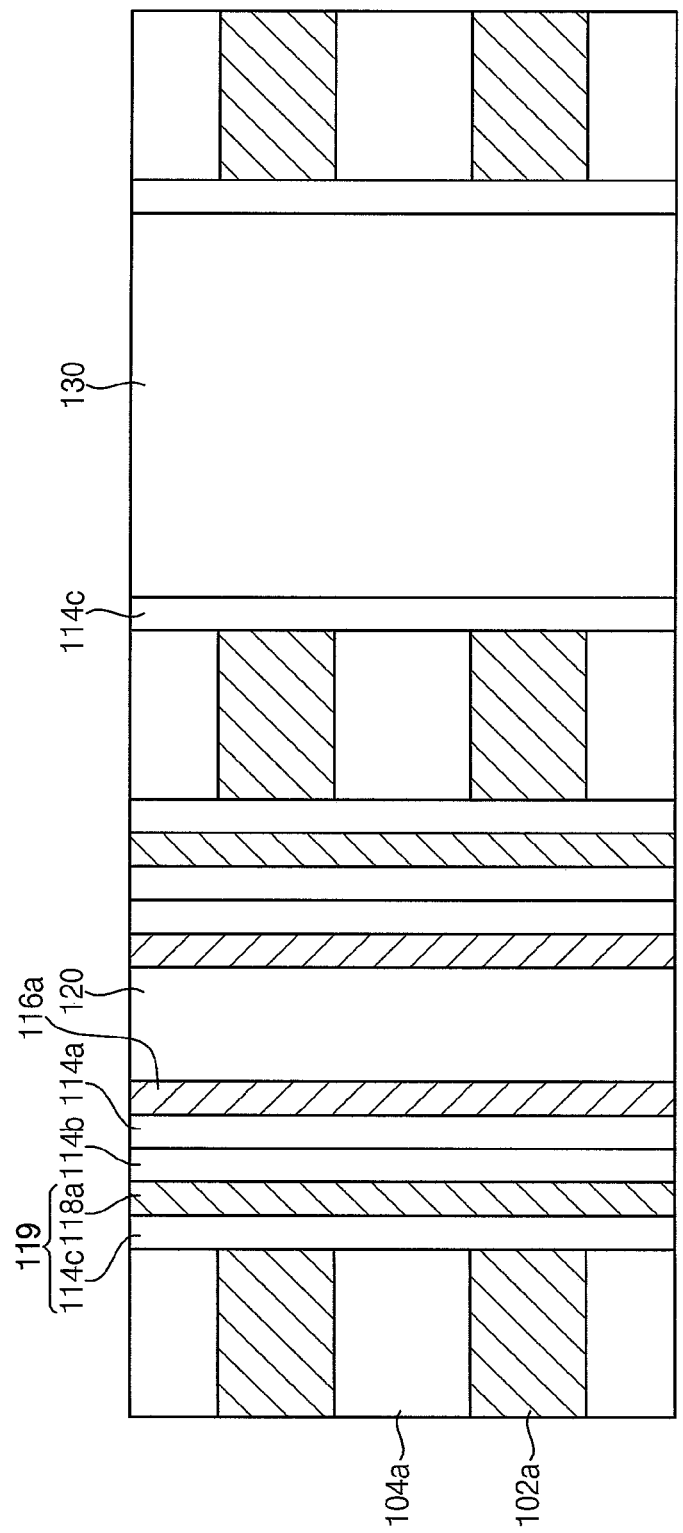

FIGS. 33 and 34 are a plan view and a cross-sectional view illustrating a vertical semiconductor device according to exemplary embodiments.

The vertical semiconductor device may be substantially the same as or similar to that illustrated in FIGS. 1 to 3, except for a stacked structure of layers included in the memory cell on the sidewalls of the trench 112.

FIG. 33 is a plan view of a portion of one conductive pattern cut in the horizontal direction, and FIG. 34 is a cross-sectional view of the vertical semiconductor device cut in the second direction.

Referring to FIGS. 33 and 34, the blocking dielectric layer 114c, the etch stop layer pattern 118a, the charge storage layer 114b, the tunnel insulation layer 114a, and the channel pattern 116a and the first insulation layer 120 may be sequentially formed on sidewalls of the trench 112 for forming the memory cell.

In example embodiments, the stacked structure 119 including the etch stop layer pattern 118a and the blocking dielectric layer 114c formed on the charge storage layer 114b may serve as a blocking layer of the cell transistor. Thus, the etch stop layer pattern 118a may have a high band gap with respect to the charge storage layer 114b.

In some example embodiments, the stacked structure including charge storage layer 114b and etch stop layer pattern 118a may serve as a charge storage structure of the cell transistor.

The etch stop layer pattern 118a may include a material having a high dry-etching selectivity with respect to the charge storage layer 114b, in a dry etching process. For example, the etch stop layer pattern 118a may include a material having a high etching selectivity with the charge storage layer 114b, in a dry etching process. That is, when silicon nitride is dry-etched, the etch stop layer pattern 118a may be hardly etched.

Also, the etch stop layer pattern 118a may include a material that may be easily removed by a wet etching process. In an example embodiment, the channel pattern 116a including, for example, polysilicon, may not be etched during the wet etching of the material included in the etch stop layer pattern 118a. Therefore, in the wet etching process, the etch stop layer pattern 118a and the channel pattern 116a may have a high etching selectivity to each other.

The etch stop layer pattern 118a may include a material, e.g., aluminum oxide, aluminum nitride, etc.

The filling insulation pattern 130 may be formed between stacked structures including the channel patterns 116a, the tunnel insulation layer 114a and the charge storage layer 114b.

In example embodiments, both sides of the filling insulation pattern 130 in the second direction may contact the blocking dielectric layer 114c. In this case, the blocking dielectric layer 114c may be continuously formed on the sidewall of the conductive pattern structure 110. Also, structures including the tunnel insulation layer 114a, the charge storage layer 114b, and the etch stop layer pattern 118a on the sidewall of the conductive pattern structure 110 may be spaced apart from each other in the first direction.

In some example embodiments, both sides of the filling insulation pattern 130 in the second direction may contact an etch stop layer. In this case, the etch stop layer may not be patterned so that the etch stop layer may cover the sidewall of the conductive pattern structure 110.

Figure 35:
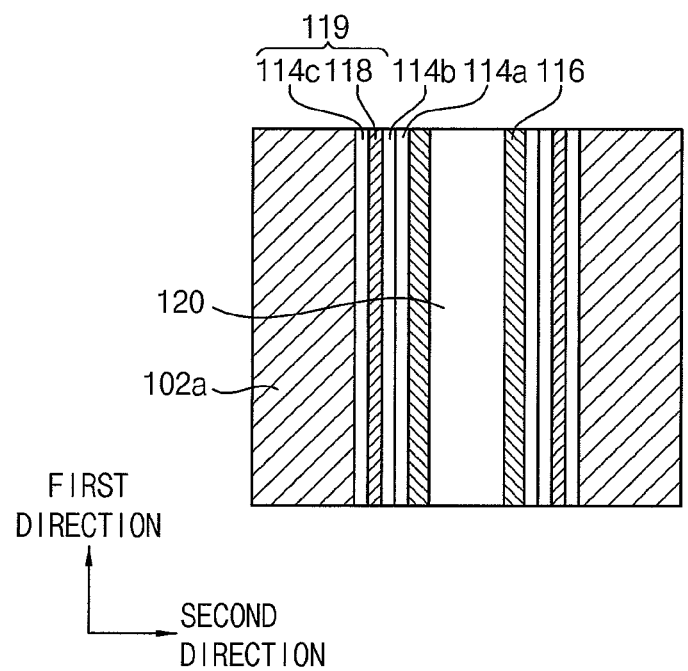
Figure 36:
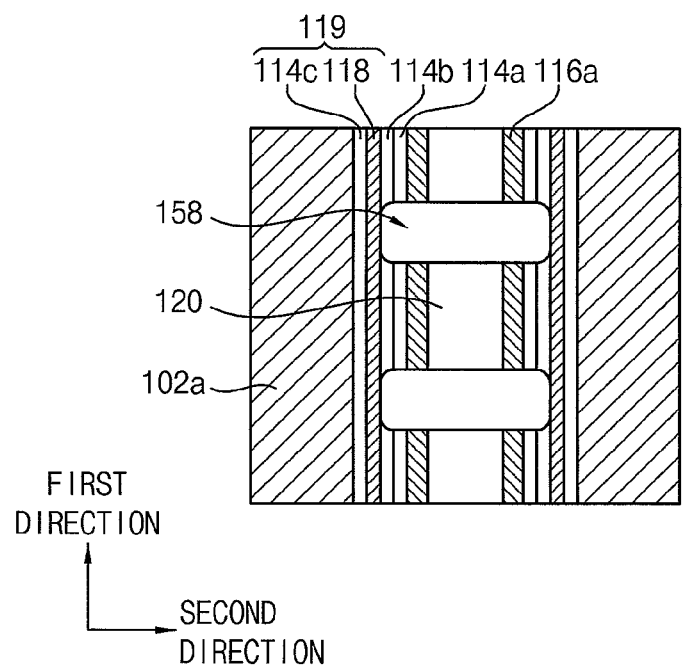
Figure 37:
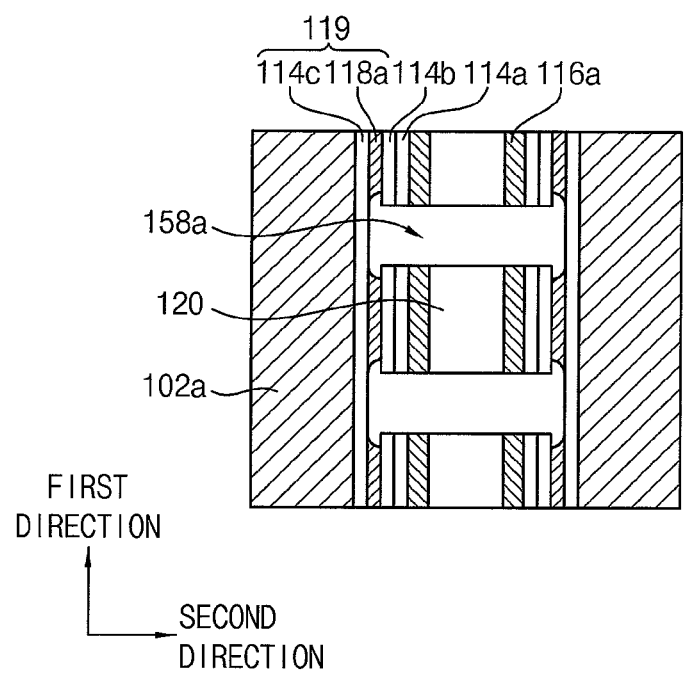

FIGS. 35 to 37 are plan views illustrating stages of a method of manufacturing a vertical semiconductor device in accordance with example embodiments.

First, processes illustrated with reference to FIGS. 6 to 8 may be performed to form the conductive pattern structures 110.

Referring to FIG. 35, the blocking dielectric layer 114c, the etch stop layer 118, the charge storage layer 114b, and the tunnel insulation layer 114a may be formed on surfaces of the conductive pattern structure 110 and the lower insulation layer 101. Also, a channel layer 116 may be formed on the tunnel insulation layer 114a. The first insulation layer 120 may be formed on the channel layer 116 to fill the trench 112.

Referring to FIG. 36, an etch mask may be formed on the first insulation layer 120, and then the first insulation layer 120, the channel layer 116, the tunnel insulation layer 114a, and the charge storage layer 114b may be dry etched to form the first holes 158.

When the dry etching process is performed, etching may be stopped at the etch stop layer 118. Thus, the etch stop layer 118 may be exposed by sidewalls of the first holes 158. When the first holes 158 are formed, the channel layer 116 may be patterned together to form a channel pattern 116a. Also, the tunnel insulation layer 114a and the charge storage layer 114b may be patterned together.

Referring to FIG. 37, the etch stop layer 118 exposed by the sidewalls of the first holes 158 may be wet etched to form the second holes 158a. The blocking dielectric layer 114c may be exposed by sidewalls of the second holes 158a in the second direction. Thus, the etch stop layer pattern 118a may be formed by the etching process for forming the second holes 158a.

As described above, the etch stop layer 118 may be removed by the wet etching process, so that the plasma damage due to the etching process may decrease.

Also, when the first holes 158 are formed, the channel layer 116 may be patterned together to form the channel pattern 116a.

In some example embodiments, the etching process of the etch stop layer may not be performed. In this case, a plan view of the vertical semiconductor device may be substantially the same as FIG. 36.

While example embodiments have been particularly shown and described, it will be understood by one of ordinary skill in the art that variations in form and detail may be made therein without departing from the spirit and scope of the claims.

What is claimed is:

1. A vertical semiconductor device, comprising:
 a plurality of conductive pattern structures, each of the plurality of conductive pattern structures extending in a first direction;
 a trench between two adjacent conductive pattern structures of the plurality of conductive pattern structures that are spaced apart from each other in a second direction crossing the first direction, wherein each of the plurality of conductive pattern structures includes a plurality of conductive patterns and a plurality of insulation layers alternately and repeatedly stacked on a substrate in a third direction perpendicular to an upper surface of the substrate;

a memory layer disposed on sidewalls of the trench, the memory layer including a blocking dielectric layer, a charge storage layer and a tunnel insulation layer stacked on each other on the sidewalls of the trench;

a plurality of first insulation layers disposed in the trench and spaced apart from each other in the first direction;

a plurality of channel patterns disposed on the memory layer and in the trench, and spaced apart from each other in the first direction; and a plurality of etch stop layer patterns disposed in the trench, each of the plurality of etch stop layer patterns being disposed between a corresponding one of the plurality of first insulation layers and the blocking dielectric layer of the memory layer, wherein the plurality of etch stop layer patterns are spaced apart from each other in the first direction.

2. The vertical semiconductor device of claim 1, wherein each of the plurality of etch stop layer patterns is disposed in the trench and on a corresponding one of the plurality of channel patterns.

3. The vertical semiconductor device of claim 1, wherein each of the plurality of etch stop layer patterns is disposed on a stacked structure including the memory layer and a corresponding one of the plurality of channel patterns or between two adjacent layers of the stacked structure in the trench.

4. The vertical semiconductor device of claim 1, wherein the plurality of etch stop layer patterns include a material having an etching selectivity with respect to materials of the plurality of first insulation layers, in a dry etch process.

5. The vertical semiconductor device of claim 1, wherein the plurality of etch stop layer patterns include a material that is removed by a wet etching process.

6. The vertical semiconductor device of claim 1, wherein the plurality of etch stop layer patterns include aluminum oxide, aluminum nitride, silicon nitride, doped silicon or germanium.

7. The vertical semiconductor device of claim 1, further comprising:
a filling insulation pattern filling the trench.

8. The vertical semiconductor device of claim 7, wherein an edge portion of the filling insulation pattern has a width in the first direction greater than a width in the first direction of a central portion of the filling insulation pattern, and
wherein the edge portion and the central portion are arranged in the second direction.

9. The vertical semiconductor device of claim 1, further comprising:
an upper insulation pattern covering an upper portion of the trench; and
an air gap defined by the upper insulation pattern and the trench.

10. The vertical semiconductor device of claim 1, wherein at least one of the charge storage layer and the tunnel insulation layer disposed in the trench is separated into a plurality of islands that are spaced apart from each other in the first direction.

11. The vertical semiconductor device of claim 1, wherein each of the plurality of etch stop layer patterns is disposed between a corresponding one of the plurality of channel patterns and the memory layer.

12. The vertical semiconductor device of claim 1, wherein each of the plurality of etch stop layer patterns is disposed between two layers among the blocking dielectric layer, the charge storage layer and the tunnel insulation layer included in the memory layer.

13. A vertical semiconductor device, comprising:
a plurality of conductive pattern structures, each of the plurality of conductive pattern structures extending in a first direction;
a trench between two adjacent conductive pattern structures of the plurality of conductive pattern structures that are spaced apart from each other in a second direction crossing the first direction, wherein each of the plurality of conductive pattern structures includes a plurality of conductive patterns and a plurality of insulation layers alternately and repeatedly stacked on a substrate in a third direction perpendicular to an upper surface of the substrate;
a memory layer disposed on sidewalls of the trench, the memory layer including a blocking dielectric layer, a charge storage layer and a tunnel insulation layer stacked on each other on the sidewalls of the trench;
a plurality of channel patterns disposed on the memory layer and in the trench, and spaced apart from each other in the first direction; and
a plurality of etch stop layer patterns disposed in the trench and spaced apart from each other in the first direction,
wherein each of the plurality of etch stop layer patterns and a corresponding one of the plurality of channel patterns are layered in the second direction and in the trench.

14. The vertical semiconductor device of claim 13, further comprising:
a plurality of first insulation layers disposed in the trench and spaced apart from each other in the first direction,
wherein each of the plurality of etch stop layer patterns is disposed between a corresponding one of the plurality of first insulation layers and the blocking dielectric layer.

15. The vertical semiconductor device of claim 14, wherein the plurality of etch stop layer patterns include a material that is removed by a wet etching process.

16. The vertical semiconductor device of claim 14, wherein the plurality of etch stop layer patterns include a material having an etching selectivity with respect to materials of the plurality of first insulation layers, in a dry etching process.

17. The vertical semiconductor device of claim 14, further comprising:
a filling insulation pattern filling the trench.

18. The vertical semiconductor device of claim 17, wherein an edge portion of the filling insulation pattern has a width in the first direction greater than a width in the first direction of a central portion of the filling insulation pattern, and
wherein the edge portion and the central portion are arranged in the second direction.

19. A vertical semiconductor device, comprising:
a plurality of conductive pattern structures, each of the plurality of conductive pattern structures extending in a first direction;
a trench between two adjacent conductive pattern structures of the plurality of conductive pattern structures that are spaced apart from each other in a second direction crossing the first direction, wherein each of the plurality of conductive pattern structures includes a plurality of conductive patterns and a plurality of insulation layers alternately and repeatedly stacked on a substrate in a third direction perpendicular to an upper surface of the substrate;

a memory layer disposed on sidewalls of the trench, the memory layer including a blocking dielectric layer, a charge storage layer and a tunnel insulation layer stacked on each other on the sidewalls of the trench;

a plurality of channel patterns disposed on the memory layer and in the trench, and spaced apart from each other in the first direction;

a plurality of first insulation layers disposed on the channel patterns in the trench and spaced apart from each other in the first direction; and a plurality of etch stop layer patterns spaced apart from each other in the first direction, wherein each of the plurality of etch stop layer patterns is disposed between a corresponding one of the plurality of first insulation layers and the blocking dielectric layer.

20. The vertical semiconductor device of claim 19, wherein at least one layer of the memory layer is disposed in the trench and separated into a plurality of islands that are spaced apart from each other in the first direction.

\* \* \* \* \*